US012615057B2

(12) United States Patent
Tsuchi

(10) Patent No.: US 12,615,057 B2
(45) Date of Patent: *Apr. 28, 2026

(54) DIGITAL-TO-ANALOG CONVERTER, DATA DRIVER, AND DISPLAY DEVICE

(71) Applicant: LAPIS Technology Co., Ltd., Yokohama (JP)

(72) Inventor: Hiroshi Tsuchi, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 163 days.

This patent is subject to a terminal disclaimer.

(21) Appl. No.: 18/415,655

(22) Filed: Jan. 18, 2024

(65) Prior Publication Data

US 2024/0259033 A1 Aug. 1, 2024

(30) Foreign Application Priority Data

Jan. 30, 2023 (JP) ................................. 2023-011897

(51) Int. Cl.
| | |
|---|---|
| *H03M 1/66* | (2006.01) |
| *G09G 3/36* | (2006.01) |
| *H03M 1/76* | (2006.01) |

(52) U.S. Cl.
CPC .......... *H03M 1/765* (2013.01); *G09G 3/3688* (2013.01); *G09G 2320/0626* (2013.01)

(58) Field of Classification Search
CPC ...... H03M 1/765; H03M 1/66; G09G 3/3688; G09G 2320/0626; G09G 3/20;
(Continued)

(56) References Cited

U.S. PATENT DOCUMENTS 7,283,082 B1 * 10/2007 Kuyel ................... H03M 1/682
341/145
7,639,167 B2 * 12/2009 Tsuchi ................ H03F 3/45179
330/261
(Continued)

FOREIGN PATENT DOCUMENTS

| JP | 2002043944 | 2/2002 |
|---|---|---|
| JP | 2006174180 | 6/2006 |

*Primary Examiner* — Jean B Jeanglaude
(74) *Attorney, Agent, or Firm* — JCIPRNET

(57) ABSTRACT

The disclosure includes: a differential amplifier, and a first decoder assigning and supplying a first or second voltage to each of a plurality of input terminals based on (K+1) bits of digital data. The differential amplifier includes $2^K$ differential pairs each driven by a tail current received individually, and a tail current control circuit supplying first to $2^{Kth}$ tail currents to the $2^K$ differential pairs and controlling first to $2^{Kth}$ current ratios for the first to $2^{Kth}$ tail currents based on the digital data. The tail current control circuit has a basic configuration that sets each of the first to $2^{Kth}$ current ratios to a maximum value, a minimum value, or an intermediate value among three predetermined values, and increases one of the maximum and minimum values and decreases the other for the current ratio of the tail currents supplied to two predetermined differential pairs.

12 Claims, 31 Drawing Sheets

(58) Field of Classification Search
   CPC ..... G09G 2310/027; G09G 2310/0286; G09G
                    2310/0289; H03F 3/45179
   See application file for complete search history.

(56)                   References Cited

U.S. PATENT DOCUMENTS

| | | | |
|---|---|---|---|
| 7,969,342 B2 * | 6/2011 | Tsuchi ................ | H03F 3/45179 |
| | | | 341/150 |
| 2006/0132344 A1 * | 6/2006 | Ishii ........................ | H03M 1/76 |
| | | | 341/144 |
| 2008/0165168 A1 * | 7/2008 | Tsuchi ................ | H03F 3/45179 |
| | | | 330/261 |
| 2010/0052966 A1 * | 3/2010 | Tsuchi ................ | H03F 3/45179 |
| | | | 341/154 |

* cited by examiner

| | | | | | | ... | | | | |
|---|---|---|---|---|---|---|---|---|---|---|
| Digital data DT | | | | | | | | | | |
| DK | — | 0 | 0 | 0 | 0 | ... | 1 | 1 | 1 | 1 |
| ... | — | ... | ... | ... | ... | ... | ... | ... | ... | ... |
| D1 | — | 0 | 0 | 1 | 1 | ... | 0 | 0 | 1 | 1 |
| D0 | — | 0 | 1 | 0 | 1 | ... | 0 | 1 | 0 | 1 |
| Non-inverting input terminal input voltage | | | | | | | | | | |
| V<1> | VA | VB | VB | VB | VB | VB | VB | VB | VB | VB |
| V<2>~V<2^K−1> | VA | VAorVB | VAorVB | VAorVB | VAorVB | VAorVB | VAorVB | VAorVB | VAorVB | VB |
| V<2^K> | VA | VA | VA | VA | VA | VA | VA | VA | VA | VB |
| Tail current ratio | | | | | | | | | | |
| m<1> | 2 | 1 | 2 | 3 | 2 | 1 or 2 or 3 | 1 | 2 | 3 | 2 |
| m<2>~m<2^K−1> | 2 | 2 | 2 | 2 | 2 | 2 | 2 | 2 | 2 | 2 |
| m<2^K> | 2 | 3 | 2 | 1 | 2 | 1 or 2 or 3 | 3 | 2 | 1 | 2 |
| Output voltage level | | | | | | | | | | |
| Vout | VA | ... | ... | ... | ... | ... | ... | ... | ... | VB |

Expected value : 
$$Vout = \frac{m\langle 1\rangle V\langle 1\rangle + m\langle 2\rangle V\langle 2\rangle + \cdots + m\langle 2^K\rangle V\langle 2^K\rangle}{m\langle 1\rangle + m\langle 2\rangle + \cdots + m\langle 2^K\rangle}$$

FIG. 2A

| | Digital data DT | | | | | | | | | |
|---|---|---|---|---|---|---|---|---|---|---|
| DK | — | 0 | 0 | 0 | 0 | ⋯ | 1 | 1 | 1 | 1 |
| ⋯ | | ⋯ | ⋯ | ⋯ | ⋯ | | ⋯ | ⋯ | ⋯ | ⋯ |
| D1 | — | 0 | 0 | 1 | 1 | ⋯ | 0 | 0 | 1 | 1 |
| D0 | — | 0 | 1 | 0 | 1 | ⋯ | 0 | 1 | 0 | 1 |
| Non-inverting input terminal input voltage | | | | | | | | | | |
| $V\langle 1\rangle$ | VA | VB | VB | VB | VB | VB | VB | VB | VB | VB |
| $V\langle 2\rangle \sim V\langle 2^K-1\rangle$ | VA | VA | VAorVB | VAorVB | VAorVB | VAorVB | VAorVB | VAorVB | VAorVB | VB |
| $V\langle 2^K\rangle$ | VA | VA | VA | VA | VA | VA | VA | VA | VA | VB |
| Tail current ratio (after correction) correction amount: $\alpha$, $\beta$ | | | | | | | | | | |
| $m\langle 1\rangle$ | 2 | $1-\alpha$ | $3+\alpha$ | 2 | $1-\alpha$ | $(1-\alpha)$ or 2 or $(3+\alpha)$ | $1-\alpha$ | 2 | $3+\alpha$ | 2 |
| $m\langle 2\rangle \sim m\langle 2^K-1\rangle$ | $2-\beta$ | $2-\beta$ | $2-\beta$ | $2-\beta$ | $2-\beta$ | $2-\beta$ | $2-\beta$ | $2-\beta$ | $2-\beta$ | $2-\beta$ |
| $m\langle 2^K\rangle$ | 2 | $3+\alpha$ | $1-\alpha$ | 2 | $3+\alpha$ | $(1-\alpha)$ or 2 or $(3+\alpha)$ | $3+\alpha$ | 2 | $1-\alpha$ | 2 |
| Output voltage level | | | | | | | | | | |
| Vout | VA | ⋯ | ⋯ | ⋯ | ⋯ | ⋯ | ⋯ | ⋯ | ⋯ | VB |

| Digital data DT | | | | | |
|---|---|---|---|---|---|
| D1 | | 0 | 0 | 1 | 1 |
| D0 | | 0 | 1 | 0 | 1 |
| Non-inverting input terminal input voltage | | | | | |
| V<1> | 4.08 | 4 | 4 | 4 | 4 |
| V<2> | 4.08 | 4.08 | 4.08 | 4.08 | 4 |
| Tail current ratio | | | | | |
| m<1> | 2 | 1 | 2 | 3 | 2 |
| m<2> | 2 | 3 | 2 | 1 | 2 |
| Output voltage | | | | | |
| Vout (expected value) | 4.08 | 4.06 | 4.04 | 4.02 | 4 |
| Vout (SIM value) | 4.080660 | 4.056696 | 4.040831 | 4.024739 | 4.000664 |
| Voffs | 0.00066 | -0.00330 | 0.00083 | 0.00474 | 0.00066 |

(VA, VB)=(4.08V, 4.0V)

Expected value: $Vout=(m{<}1{>}V{<}1{>}+m{<}2{>}V{<}2{>})/(m{<}1{>}+m{<}2{>})$

| Digital data DT | | | | | |
|---|---|---|---|---|---|
| D1 | | 0 | 0 | 1 | 1 |
| D0 | | 0 | 1 | 0 | 1 |
| Non-inverting input terminal input voltage | | | | | |
| V<1> | 4.08 | 4 | 4 | 4 | 4 |
| V<2> | 4.08 | 4.08 | 4.08 | 4.08 | 4 |
| Tail current ratio (after correction): $\alpha{=}0.2$ | | | | | |
| m<1> | 2 | 0.8 | 2 | 3.2 | 2 |
| m<2> | 2 | 3.2 | 2 | 0.8 | 2 |
| Output voltage | | | | | |
| Vout (expected value) | 4.08 | 4.06 | 4.04 | 4.02 | 4 |
| Vout (SIM value) | 4.080660 | 4.060506 | 4.040823 | 4.020956 | 4.000664 |
| Voffs | 0.000664 | 0.000506 | 0.000823 | 0.000956 | 0.000664 |

FIG. 4B

Vout (expected value)

Vout (expected value)

Vout (expected value)

K=2

| | | | | | | | | | | |
|---|---|---|---|---|---|---|---|---|---|---|
| Digital data DT | D2 | | 0 | 0 | 0 | 0 | 1 | 1 | 1 | 1 |
| | D1 | | 0 | 0 | 1 | 1 | 0 | 0 | 1 | 1 |
| | D0 | | 0 | 1 | 0 | 1 | 0 | 1 | 0 | 1 |
| Non-inverting input terminal input voltage | V<1> | 4.0368 | 4 | 4 | 4 | 4 | 4 | 4 | 4 | 4 |
| | V<2> | 4.0368 | 4.0368 | 4.0368 | 4 | 4 | 4 | 4 | 4 | 4 |
| | V<3> | 4.0368 | 4.0368 | 4.0368 | 4.0368 | 4.0368 | 4 | 4 | 4 | 4 |
| | V<4> | 4.0368 | 4.0368 | 4.0368 | 4.0368 | 4.0368 | 4.0368 | 4.0368 | 4.0368 | 4 |
| Tail current ratio | m<1> | 2 | 1 | 2 | 2 | 2 | 2 | 2 | 3 | 2 |
| | m<2> | 2 | 2 | 2 | 1 | 2 | 2 | 2 | 2 | 2 |
| | m<3> | 2 | 2 | 2 | 2 | 2 | 1 | 2 | 2 | 2 |
| | m<4> | 2 | 3 | 2 | 3 | 2 | 3 | 2 | 1 | 2 |
| Output voltage | Vout (expected value) | 4.0368 | 4.0322 | 4.0276 | 4.0230 | 4.0184 | 4.0138 | 4.0092 | 4.0046 | 4.0000 |
| | Vout (SIM value) | 4.037385 | 4.032219 | 4.028290 | 4.024623 | 4.018967 | 4.013374 | 4.009740 | 4.005775 | 4.000585 |
| | Voffs | 0.00059 | 0.00002 | 0.00069 | 0.00162 | 0.00057 | -0.00043 | 0.00054 | 0.00118 | 0.00059 |

(VA, VB) = (4.0368V, 4.0V)

$$Vout = (m\langle1\rangle V\langle1\rangle + m\langle2\rangle V\langle2\rangle + m\langle3\rangle V\langle3\rangle + m\langle4\rangle V\langle4\rangle) / (m\langle1\rangle + m\langle2\rangle + m\langle3\rangle + m\langle4\rangle)$$

| | | Digital data DT | | | | | | | |
|---|---|---|---|---|---|---|---|---|---|
| D2 | | 0 | 0 | 0 | 0 | 1 | 1 | 1 | 1 |
| D1 | | 0 | 0 | 1 | 1 | 0 | 0 | 1 | 1 |
| D0 | | 0 | 1 | 0 | 1 | 0 | 1 | 0 | 1 |
| Non-inverting input terminal input voltage | | | | | | | | | |
| V<1> | 4.0368 | 4 | 4 | 4 | 4 | 4 | 4 | 4 | 4 |
| V<2> | 4.0368 | 4.0368 | 4.0368 | 4 | 4 | 4 | 4 | 4 | 4 |
| V<3> | 4.0368 | 4.0368 | 4.0368 | 4.0368 | 4.0368 | 4 | 4 | 4 | 4 |
| V<4> | 4.0368 | 4.0368 | 4.0368 | 4.0368 | 4.0368 | 4.0368 | 4.0368 | 4 | 4 |
| Tail current ratio (after correction) $\alpha=0.15$, $\beta=0.08$ | | | | | | | | | |
| m<1> | 2 | 0.85 | 2 | 3.15 | 2 | 0.85 | 2 | 3.15 | 2 |
| m<2> | 1.92 | 1.92 | 1.92 | 1.92 | 1.92 | 1.92 | 1.92 | 1.92 | 1.92 |
| m<3> | 1.92 | 1.92 | 1.92 | 1.92 | 1.92 | 1.92 | 1.92 | 1.92 | 1.92 |
| m<4> | 2 | 3.15 | 2 | 0.85 | 2 | 3.15 | 2 | 0.85 | 2 |
| Output voltage | | | | | | | | | |
| Vout (expected value) | 4.0368 | 4.0322 | 4.0276 | 4.0230 | 4.0184 | 4.0138 | 4.0092 | 4.0046 | 4.0000 |
| Vout (SIM value) | 4.037393 | 4.032790 | 4.028123 | 4.023784 | 4.018956 | 4.014235 | 4.00996 | 4.005224 | 4.000593 |
| Voffs | 0.000593 | 0.000590 | 0.000523 | 0.000784 | 0.000555 | 0.000435 | 0.00076 | 0.000624 | 0.000593 |

FIG. 8B

Vout (expected value)

Vout (expected value)

Vout (expected value)

K=2

| | | (ref) | | | | | | | | |
|---|---|---|---|---|---|---|---|---|---|---|
| Digital data DT | D2 | | 0 | 0 | 0 | 0 | 1 | 1 | 1 | 1 |
| | D1 | | 0 | 0 | 1 | 1 | 0 | 0 | 1 | 1 |
| | D0 | | 0 | 1 | 0 | 1 | 0 | 1 | 0 | 1 |
| Non-inverting input terminal input voltage | V⟨1⟩ | 4.0368 | 4 | 4 | 4 | 4 | 4 | 4 | 4 | 4 |
| | V⟨2⟩ | 4.0368 | 4.0368 | 4.0368 | 4.0368 | 4 | 4 | 4 | 4 | 4 |
| | V⟨3⟩ | 4.0368 | 4.0368 | 4.0368 | 4.0368 | 4.0368 | 4 | 4 | 4 | 4 |
| | V⟨4⟩ | 4.0368 | 4.0368 | 4.0368 | 4.0368 | 4.0368 | 4.0368 | 4.0368 | 4.0368 | 4 |
| Tail current ratio | m⟨1⟩ | 2 | 1 | 2 | 3 | 2 | 2 | 2 | 2 | 2 |
| | m⟨2⟩ | 2 | 2 | 2 | 2 | 2 | 1 | 2 | 3 | 2 |
| | m⟨3⟩ | 2 | 3 | 2 | 1 | 2 | 2 | 2 | 2 | 2 |
| | m⟨4⟩ | 2 | 2 | 2 | 2 | 2 | 3 | 2 | 1 | 2 |
| Output voltage | Vout (expected value) | 4.0368 | 4.0322 | 4.0276 | 4.0230 | 4.0184 | 4.0138 | 4.0092 | 4.0046 | 4.0000 |
| | Vout (SIM value) | 4.037385 | 4.032219 | 4.028290 | 4.024623 | 4.018967 | 4.013374 | 4.009740 | 4.005775 | 4.000585 |
| | Voffs | 0.00059 | 0.00002 | 0.00069 | 0.00162 | 0.00057 | -0.00043 | 0.00054 | 0.00118 | 0.00059 |

$(VA, VB) = (4.0368V, 4.0V)$ $Vout = (m\langle 1\rangle V\langle 1\rangle + m\langle 2\rangle V\langle 2\rangle + m\langle 3\rangle V\langle 3\rangle + m\langle 4\rangle V\langle 4\rangle) / (m\langle 1\rangle + m\langle 2\rangle + m\langle 3\rangle + m\langle 4\rangle)$

| | ref | | | | | | | | |
|---|---|---|---|---|---|---|---|---|---|
| Digital data DT | | | | | | | | | |
| D2 | | 1 | 1 | 1 | 1 | 0 | 0 | 0 | 0 |
| D1 | | 1 | 1 | 0 | 0 | 1 | 1 | 0 | 0 |
| D0 | | 1 | 0 | 1 | 0 | 1 | 0 | 1 | 0 |
| Non-inverting input terminal input voltage | | | | | | | | | |
| V⟨1⟩ | 4.0368 | 4.0368 | 4.0368 | 4.0368 | 4.0368 | 4.0368 | 4.0368 | 4.0368 | 4 |
| V⟨2⟩ | 4.0368 | 4.0368 | 4.0368 | 4.0368 | 4.0368 | 4.0368 | 4 | 4 | 4 |
| V⟨3⟩ | 4.0368 | 4.0368 | 4.0368 | 4.0368 | 4 | 4 | 4 | 4 | 4 |
| V⟨4⟩ | 4.0368 | 4.0368 | 4 | 4 | 4 | 4 | 4 | 4 | 4 |
| Tail current ratio (after correction) α=0.15, β=0.08 | | | | | | | | | |
| m⟨1⟩ | 2 | 2 | 3.15 | 2 | 0.85 | 2 | 3.15 | 2 | 0.85 |
| m⟨2⟩ | 1.92 | 1.92 | 1.92 | 1.92 | 1.92 | 1.92 | 1.92 | 1.92 | 1.92 |
| m⟨3⟩ | 2 | 1.92 | 1.92 | 0.85 | 1.92 | 2 | 1.92 | 1.92 | 3.15 |
| m⟨4⟩ | 1.92 | 2 | 1.92 | 1.92 | 3.15 | 1.92 | 2 | 1.92 | 0.85 |
| Output voltage | | | | | | | | | |
| Vout (expected value) | 4.0368 | 4.0322 | 4.0276 | 4.0230 | 4.0184 | 4.0138 | 4.0092 | 4.0046 | 4.0000 |
| Vout (SIM value) | 4.037393 | 4.032790 | 4.028123 | 4.023784 | 4.018956 | 4.014235 | 4.00996 | 4.005224 | 4.000593 |
| Voffs | 0.000593 | 0.000590 | 0.000523 | 0.000784 | 0.000555 | 0.000435 | 0.00076 | 0.00624 | 0.000593 |

| Digital data DT | C1 | C2 | C3 | C4 | C5 | C6 | C7 | C8 | C9 |
|---|---|---|---|---|---|---|---|---|---|
| D3 | 0 | 0 | 0 | 0 | 0 | 0 | 0 | 0 | 1 |
| D2 | 0 | 0 | 0 | 0 | 1 | 1 | 1 | 1 | 0 |
| D1 | 0 | 0 | 1 | 1 | 0 | 0 | 1 | 1 | 0 |
| D0 | 0 | 1 | 0 | 1 | 0 | 1 | 0 | 1 | 0 |

| Non-inverting input terminal input voltage | | | | | | | | | |
|---|---|---|---|---|---|---|---|---|---|
| V⟨1⟩ | 4.0736 | 4 | 4 | 4 | 4 | 4 | 4 | 4 | 4 |
| V⟨2⟩ | 4.0736 | 4.0736 | 4.0736 | 4 | 4 | 4 | 4 | 4 | 4 |
| V⟨3⟩ | 4.0736 | 4.0736 | 4.0736 | 4.0736 | 4.0736 | 4 | 4 | 4 | 4 |
| V⟨4⟩ | 4.0736 | 4.0736 | 4.0736 | 4.0736 | 4.0736 | 4.0736 | 4.0736 | 4 | 4 |
| V⟨5⟩ | 4.0736 | 4.0736 | 4.0736 | 4.0736 | 4.0736 | 4.0736 | 4.0736 | 4.0736 | 4.0736 |
| V⟨6⟩ | 4.0736 | 4.0736 | 4.0736 | 4.0736 | 4.0736 | 4.0736 | 4.0736 | 4.0736 | 4.0736 |
| V⟨7⟩ | 4.0736 | 4.0736 | 4.0736 | 4.0736 | 4.0736 | 4.0736 | 4.0736 | 4.0736 | 4.0736 |
| V⟨8⟩ | 4.0736 | 4.0736 | 4.0736 | 4.0736 | 4.0736 | 4.0736 | 4.0736 | 4.0736 | 4.0736 |

| Tail current ratio | | | | | | | | | |
|---|---|---|---|---|---|---|---|---|---|
| m⟨1⟩ | 2 | 1 | 2 | 3 | 1 | 2 | 3 | 3 | 2 |
| m⟨2⟩ | 2 | 2 | 2 | 2 | 2 | 2 | 2 | 2 | 2 |
| m⟨3⟩ | 2 | 2 | 2 | 2 | 2 | 2 | 2 | 2 | 2 |
| m⟨4⟩ | 2 | 2 | 2 | 2 | 2 | 2 | 2 | 2 | 2 |
| m⟨5⟩ | 2 | 2 | 2 | 2 | 2 | 2 | 2 | 2 | 2 |
| m⟨6⟩ | 2 | 2 | 2 | 2 | 2 | 2 | 2 | 2 | 2 |
| m⟨7⟩ | 2 | 2 | 2 | 2 | 2 | 2 | 2 | 1 | 2 |
| m⟨8⟩ | 2 | 3 | 2 | 1 | 3 | 2 | 1 | 2 | 2 |

| Output voltage | | | | | | | | | |
|---|---|---|---|---|---|---|---|---|---|
| Vout (expected value) | 4.0736 | 4.0690 | 4.0644 | 4.0598 | 4.0552 | 4.0506 | 4.0460 | 4.0414 | 4.0368 |
| Vout (SIM value) | 4.0741 | 4.0695 | 4.0655 | 4.0617 | 4.0564 | 4.0512 | 4.0470 | 4.0429 | 4.0374 |
| Voffs | 0.0005 | 0.0005 | 0.0011 | 0.0019 | 0.0012 | 0.0006 | 0.0010 | 0.0015 | 0.0006 |

$(VA, VB) = (4.0736V, 4.0V)$ $Vout = (m\langle 1\rangle V\langle 1\rangle + m\langle 2\rangle V\langle 2\rangle + \cdots + m\langle 8\rangle V\langle 8\rangle) / (m\langle 1\rangle + m\langle 2\rangle + \cdots + m\langle 8\rangle)$

| | | | | | | | | |
|---|---|---|---|---|---|---|---|---|
| Digital data DT | | | | | | | | |
| D3 | 1 | 1 | 1 | 1 | 1 | 1 | 1 | 1 |
| D2 | 0 | 0 | 0 | 0 | 1 | 1 | 1 | 1 |
| D1 | 0 | 0 | 1 | 1 | 0 | 0 | 1 | 1 |
| D0 | 0 | 1 | 0 | 1 | 0 | 1 | 0 | 1 |
| Non-inverting input terminal input voltage | | | | | | | | |
| V<1> | 4 | 4 | 4 | 4 | 4 | 4 | 4 | 4 |
| V<2> | 4 | 4 | 4 | 4 | 4 | 4 | 4 | 4 |
| V<3> | 4 | 4 | 4 | 4 | 4 | 4 | 4 | 4 |
| V<4> | 4 | 4 | 4 | 4 | 4 | 4 | 4 | 4 |
| V<5> | 4 | 4 | 4 | 4 | 4 | 4 | 4 | 4 |
| V<6> | 4.0736 | 4 | 4 | 4 | 4 | 4 | 4 | 4 |
| V<7> | 4.0736 | 4.0736 | 4.0736 | 4 | 4 | 4 | 4 | 4 |
| V<8> | 4.0736 | 4.0736 | 4.0736 | 4.0736 | 4.0736 | 4.0736 | 4.0736 | 4.0736 |
| Tail current ratio | | | | | | | | |
| m<1> | 1 | 2 | 3 | 1 | 2 | 2 | 3 | 2 |
| m<2> | 2 | 2 | 2 | 2 | 2 | 2 | 2 | 2 |
| m<3> | 2 | 2 | 2 | 2 | 2 | 2 | 2 | 2 |
| m<4> | 2 | 2 | 2 | 2 | 2 | 2 | 2 | 2 |
| m<5> | 2 | 2 | 2 | 2 | 2 | 2 | 2 | 2 |
| m<6> | 2 | 2 | 2 | 2 | 2 | 2 | 2 | 2 |
| m<7> | 2 | 2 | 2 | 2 | 2 | 2 | 2 | 2 |
| m<8> | 3 | 2 | 1 | 2 | 2 | 1 | 2 | 2 |
| Output voltage | | | | | | | | |
| Vout (expected value) | 4.0322 | 4.0276 | 4.0230 | 4.0184 | 4.0138 | 4.0092 | 4.0046 | 4.0000 |
| Vout (SIM value) | 4.0318 | 4.0277 | 4.0236 | 4.0183 | 4.0130 | 4.0092 | 4.0052 | 4.0005 |
| Voffs | -0.0004 | 0.0001 | 0.0006 | -0.0001 | -0.0008 | 0.0000 | 0.0006 | 0.0005 |

| Group | Row | | | | | | | | | |
|---|---|---|---|---|---|---|---|---|---|---|
| Digital data DT | D3 | 1 | 0 | 0 | 0 | 0 | 0 | 0 | 0 | 0 |
| | D2 | 0 | 1 | 1 | 1 | 1 | 0 | 0 | 0 | 0 |
| | D1 | 0 | 1 | 1 | 0 | 0 | 1 | 1 | 0 | 0 |
| | D0 | 0 | 1 | 0 | 1 | 0 | 1 | 0 | 1 | 0 |
| Non-inverting input terminal input voltage | V<1> | 4 | 4 | 4 | 4 | 4 | 4 | 4 | 4 | 4.0736 |
| | V<2> | 4 | 4 | 4 | 4 | 4 | 4 | 4 | 4.0736 | 4.0736 |
| | V<3> | 4 | 4 | 4 | 4 | 4 | 4 | 4.0736 | 4.0736 | 4.0736 |
| | V<4> | 4 | 4 | 4 | 4 | 4 | 4.0736 | 4.0736 | 4.0736 | 4.0736 |
| | V<5> | 4 | 4 | 4 | 4 | 4.0736 | 4.0736 | 4.0736 | 4.0736 | 4.0736 |
| | V<6> | 4 | 4 | 4 | 4.0736 | 4.0736 | 4.0736 | 4.0736 | 4.0736 | 4.0736 |
| | V<7> | 4 | 4 | 4.0736 | 4.0736 | 4.0736 | 4.0736 | 4.0736 | 4.0736 | 4.0736 |
| | V<8> | 4 | 4.0736 | 4.0736 | 4.0736 | 4.0736 | 4.0736 | 4.0736 | 4.0736 | 4.0736 |
| Tail current ratio (after correction) α=0.05, β=0.18 | m<1> | 2 | 3.05 | 2 | 0.95 | 2 | 3.05 | 2 | 0.95 | 2 |
| | m<2> | 1.82 | 1.82 | 1.82 | 1.82 | 1.82 | 1.82 | 1.82 | 1.82 | 1.82 |
| | m<3> | 1.82 | 1.82 | 1.82 | 1.82 | 1.82 | 1.82 | 1.82 | 1.82 | 1.82 |
| | m<4> | 1.82 | 1.82 | 1.82 | 1.82 | 1.82 | 1.82 | 1.82 | 1.82 | 1.82 |
| | m<5> | 1.82 | 1.82 | 1.82 | 1.82 | 1.82 | 1.82 | 1.82 | 1.82 | 1.82 |
| | m<6> | 1.82 | 1.82 | 1.82 | 1.82 | 1.82 | 1.82 | 1.82 | 1.82 | 1.82 |
| | m<7> | 1.82 | 1.82 | 1.82 | 1.82 | 1.82 | 1.82 | 1.82 | 1.82 | 1.82 |
| | m<8> | 2 | 0.95 | 2 | 3.05 | 2 | 0.95 | 2 | 3.05 | 2 |
| Output voltage | Vout (expected value) | 4.0368 | 4.0414 | 4.0460 | 4.0506 | 4.0552 | 4.0598 | 4.0644 | 4.0690 | 4.0736 |
| | Vout (SIM value) | 4.0374 | 4.0422 | 4.0468 | 4.0515 | 4.0561 | 4.0608 | 4.0650 | 4.0695 | 4.0742 |
| | Voffs | 0.0006 | 0.0008 | 0.0008 | 0.0009 | 0.0009 | 0.0010 | 0.0006 | 0.0005 | 0.0006 |

| Digital data DT | | | | | | | | |
|---|---|---|---|---|---|---|---|---|
| D3 | 1 | 1 | 1 | 1 | 1 | 1 | 1 | 1 |
| D2 | 0 | 0 | 0 | 0 | 1 | 1 | 1 | 1 |
| D1 | 0 | 0 | 1 | 1 | 0 | 0 | 1 | 1 |
| D0 | 0 | 1 | 0 | 1 | 0 | 1 | 0 | 1 |
| Non-inverting input terminal input voltage | | | | | | | | |
| V<1> | 4 | 4 | 4 | 4 | 4 | 4 | 4 | 4 |
| V<2> | 4 | 4 | 4 | 4 | 4 | 4 | 4 | 4 |
| V<3> | 4 | 4 | 4 | 4 | 4 | 4 | 4 | 4 |
| V<4> | 4 | 4 | 4 | 4 | 4 | 4 | 4 | 4 |
| V<5> | 4 | 4 | 4 | 4 | 4 | 4 | 4 | 4 |
| V<6> | 4.0736 | 4 | 4 | 4 | 4 | 4 | 4 | 4 |
| V<7> | 4.0736 | 4.0736 | 4 | 4 | 4 | 4 | 4 | 4 |
| V<8> | 4.0736 | 4.0736 | 4.0736 | 4.0736 | 4.0736 | 4.0736 | 4.0736 | 4.0736 |
| Tail current ratio (after correction) $\alpha=0.05,\ \beta=0.18$ | | | | | | | | |
| m<1> | 0.95 | 2 | 3.05 | 2 | 0.95 | 2 | 3.05 | 2 |
| m<2> | 1.82 | 1.82 | 1.82 | 1.82 | 1.82 | 1.82 | 1.82 | 1.82 |
| m<3> | 1.82 | 1.82 | 1.82 | 1.82 | 1.82 | 1.82 | 1.82 | 1.82 |
| m<4> | 1.82 | 1.82 | 1.82 | 1.82 | 1.82 | 1.82 | 1.82 | 1.82 |
| m<5> | 1.82 | 1.82 | 1.82 | 1.82 | 1.82 | 1.82 | 1.82 | 1.82 |
| m<6> | 1.82 | 1.82 | 1.82 | 1.82 | 1.82 | 1.82 | 1.82 | 1.82 |
| m<7> | 1.82 | 1.82 | 1.82 | 1.82 | 1.82 | 1.82 | 1.82 | 1.82 |
| m<8> | 3.05 | 2 | 0.95 | 2 | 3.05 | 2 | 0.95 | 2 |
| Output voltage | | | | | | | | |
| Vout (expected value) | 4.0322 | 4.0276 | 4.0230 | 4.0184 | 4.0138 | 4.0092 | 4.0046 | 4.0000 |
| Vout (SIM value) | 4.0325 | 4.0280 | 4.0233 | 4.0187 | 4.0140 | 4.0097 | 4.0053 | 4.0006 |
| Voffs | 0.0003 | 0.0004 | 0.0003 | 0.0003 | 0.0002 | 0.0005 | 0.0007 | 0.0006 |

FIG. 14D

Vout (expected value)

Vout (expected value)

Vout (expected value)

K=3

| | | | | | | | | | |
|---|---|---|---|---|---|---|---|---|---|
| Digital data DT | | | | | | | | | |
| D3 | 0 | 0 | 0 | 0 | 0 | 0 | 0 | 0 | 1 |
| D2 | 0 | 0 | 0 | 0 | 1 | 1 | 1 | 1 | 0 |
| D1 | 0 | 0 | 1 | 1 | 0 | 0 | 1 | 1 | 0 |
| D0 | 0 | 1 | 0 | 1 | 0 | 1 | 0 | 1 | 0 |
| Non-inverting input terminal voltage | | | | | | | | | |
| V⟨1⟩ | 4.0736 | 4.0736 | 4.0736 | 4 | 4.0736 | 4.0736 | 4.0736 | 4 | 4.0736 |
| V⟨2⟩ | 4.0736 | 4 | 4 | 4 | 4.0736 | 4 | 4 | 4 | 4.0736 |
| V⟨3⟩ | 4.0736 | 4.0736 | 4.0736 | 4.0736 | 4.0736 | 4.0736 | 4.0736 | 4.0736 | 4.0736 |
| V⟨4⟩(=V⟨3⟩) | 4.0736 | 4.0736 | 4.0736 | 4.0736 | 4.0736 | 4.0736 | 4.0736 | 4.0736 | 4.0736 |
| V⟨5⟩ | 4.0736 | 4.0736 | 4.0736 | 4.0736 | 4.0736 | 4.0736 | 4.0736 | 4.0736 | 4 |
| V⟨6⟩(=V⟨5⟩) | 4.0736 | 4.0736 | 4.0736 | 4.0736 | 4.0736 | 4.0736 | 4.0736 | 4.0736 | 4 |
| V⟨7⟩ | 4.0736 | 4.0736 | 4.0736 | 4.0736 | 4 | 4 | 4 | 4 | 4 |
| V⟨8⟩(=V⟨7⟩) | 4.0736 | 4.0736 | 4.0736 | 4.0736 | 4 | 4 | 4 | 4 | 4 |
| Tail current ratio | | | | | | | | | |
| m⟨1⟩ | 2 | 3 | 2 | 1 | 2 | 3 | 2 | 1 | 2 |
| m⟨2⟩ | 2 | 1 | 2 | 2 | 2 | 1 | 2 | 2 | 2 |
| m⟨3⟩ | 2 | 2 | 2 | 3 | 2 | 2 | 2 | 3 | 2 |
| m⟨4⟩ | 2 | 2 | 2 | 2 | 2 | 2 | 2 | 2 | 2 |
| m⟨5⟩ | 2 | 2 | 2 | 2 | 2 | 2 | 2 | 2 | 2 |
| m⟨6⟩ | 2 | 2 | 2 | 2 | 2 | 2 | 2 | 2 | 2 |
| m⟨7⟩ | 2 | 2 | 2 | 2 | 2 | 2 | 2 | 2 | 2 |
| m⟨8⟩ | 2 | 2 | 2 | 2 | 2 | 2 | 2 | 2 | 2 |
| Output voltage | | | | | | | | | |
| Vout (expected value) | 4.0736 | 4.0690 | 4.0644 | 4.0598 | 4.0552 | 4.0506 | 4.0460 | 4.0414 | 4.0368 |
| Vout (SIM value) | 4.0741 | 4.0694 | 4.0654 | 4.0616 | 4.0563 | 4.0510 | 4.0468 | 4.0428 | 4.0372 |
| Voffs | 0.0005 | 0.0004 | 0.0010 | 0.0018 | 0.0011 | 0.0004 | 0.0008 | 0.0014 | 0.0004 |

(VA, VB) = (4.0736V, 4.0V)

$$Vout = (m\langle 1\rangle V\langle 1\rangle + m\langle 2\rangle V\langle 2\rangle + \cdots + m\langle 8\rangle V\langle 8\rangle)/(m\langle 1\rangle + m\langle 2\rangle + \cdots + m\langle 8\rangle)$$

| | | | | Digital data DT | | | | |
|---|---|---|---|---|---|---|---|---|
| D3 | 1 | 1 | 1 | 1 | 1 | 1 | 1 | 1 |
| D2 | 0 | 0 | 0 | 0 | 1 | 1 | 1 | 1 |
| D1 | 0 | 0 | 1 | 1 | 0 | 0 | 1 | 1 |
| D0 | 0 | 1 | 0 | 1 | 0 | 1 | 0 | 1 |
| Non-inverting input terminal input voltage | | | | | | | | |
| V<1> | 4 | 4 | 4 | 4 | 4 | 4 | 4 | 4 |
| V<2> | 4.0736 | 4.0736 | 4.0736 | 4.0736 | 4.0736 | 4.0736 | 4.0736 | 4 |
| V<3> | 4 | 4 | 4 | 4 | 4 | 4 | 4 | 4 |
| V<4> | 4 | 4 | 4 | 4 | 4 | 4 | 4 | 4 |
| V<5> | 4 | 4 | 4 | 4 | 4 | 4 | 4 | 4 |
| V<6> | 4 | 4 | 4 | 4 | 4 | 4 | 4 | 4 |
| V<7> | 4.0736 | 4.0736 | 4.0736 | 4.0736 | 4 | 4 | 4 | 4 |
| V<8> | 4.0736 | 4.0736 | 4.0736 | 4 | 4 | 4 | 4 | 4 |
| Tail current ratio | | | | | | | | |
| m<1> | 1 | 2 | 2 | 3 | 1 | 2 | 3 | 2 |
| m<2> | 2 | 2 | 2 | 2 | 3 | 2 | 1 | 2 |
| m<3> | 2 | 2 | 2 | 2 | 2 | 2 | 2 | 2 |
| m<4> | 2 | 2 | 2 | 2 | 2 | 2 | 2 | 2 |
| m<5> | 2 | 2 | 2 | 2 | 2 | 2 | 2 | 2 |
| m<6> | 2 | 2 | 2 | 2 | 2 | 2 | 2 | 2 |
| m<7> | 2 | 2 | 2 | 2 | 2 | 2 | 2 | 2 |
| m<8> | 3 | 2 | 2 | 1 | 2 | 2 | 2 | 2 |
| Output voltage | | | | | | | | |
| Vout (expected value) | 4.0322 | 4.0276 | 4.0230 | 4.0184 | 4.0138 | 4.0092 | 4.0046 | 4.0000 |
| Vout (SIM value) | 4.0316 | 4.0275 | 4.0235 | 4.0182 | 4.0128 | 4.0091 | 4.0052 | 4.0005 |
| Voffs | -0.0006 | -0.0001 | 0.0005 | -0.0002 | -0.0010 | -0.0001 | 0.0006 | 0.0005 |

| | | | | | | | | | |
|---|---|---|---|---|---|---|---|---|---|
| Digital data DT | | | | | | | | | |
| D3 | 0 | 0 | 0 | 0 | 0 | 0 | 0 | 0 | 1 |
| D2 | 0 | 0 | 0 | 0 | 1 | 1 | 1 | 1 | 0 |
| D1 | 0 | 0 | 1 | 1 | 0 | 0 | 1 | 1 | 0 |
| D0 | 0 | 1 | 0 | 1 | 0 | 1 | 0 | 1 | 0 |
| Non-inverting input terminal input voltage | | | | | | | | | |
| V<1> | 4.0736 | 4 | 4 | 4 | 4 | 4 | 4 | 4 | 4 |
| V<2> | 4.0736 | 4.0736 | 4 | 4 | 4 | 4 | 4 | 4 | 4 |
| V<3> | 4.0736 | 4.0736 | 4.0736 | 4.0736 | 4 | 4 | 4 | 4 | 4 |
| V<4> (=V<3>) | 4.0736 | 4.0736 | 4.0736 | 4.0736 | 4 | 4 | 4 | 4 | 4 |
| V<5> | 4.0736 | 4.0736 | 4.0736 | 4.0736 | 4.0736 | 4.0736 | 4 | 4 | 4 |
| V<6> (=V<5>) | 4.0736 | 4.0736 | 4.0736 | 4.0736 | 4.0736 | 4.0736 | 4 | 4 | 4 |
| V<7> | 4.0736 | 4.0736 | 4.0736 | 4.0736 | 4.0736 | 4.0736 | 4.0736 | 4.0736 | 4 |
| V<8> (=V<7>) | 4.0736 | 4.0736 | 4.0736 | 4.0736 | 4.0736 | 4.0736 | 4.0736 | 4.0736 | 4 |
| Tail current ratio (after correction) $\alpha=0.05$, $\beta=0.18$ | | | | | | | | | |
| m<1> | 2 | 0.95 | 2 | 3.05 | 2 | 0.95 | 2 | 3.05 | 2 |
| m<2> | 1.82 | 1.82 | 1.82 | 1.82 | 1.82 | 1.82 | 1.82 | 1.82 | 1.82 |
| m<3> | 1.82 | 1.82 | 1.82 | 1.82 | 1.82 | 1.82 | 1.82 | 1.82 | 1.82 |
| m<4> | 1.82 | 1.82 | 1.82 | 1.82 | 1.82 | 1.82 | 1.82 | 1.82 | 1.82 |
| m<5> | 1.82 | 1.82 | 1.82 | 1.82 | 1.82 | 1.82 | 1.82 | 1.82 | 1.82 |
| m<6> | 1.82 | 1.82 | 1.82 | 1.82 | 1.82 | 1.82 | 1.82 | 1.82 | 1.82 |
| m<7> | 1.82 | 1.82 | 1.82 | 1.82 | 1.82 | 1.82 | 1.82 | 1.82 | 1.82 |
| m<8> | 2 | 3.05 | 2 | 0.95 | 2 | 3.05 | 2 | 0.95 | 2 |
| Output voltage | | | | | | | | | |
| Vout (expected value) | 4.0736 | 4.0690 | 4.0644 | 4.0598 | 4.0552 | 4.0506 | 4.0460 | 4.0414 | 4.0368 |
| Vout (SIM value) | 4.0741 | 4.0693 | 4.0648 | 4.0605 | 4.0558 | 4.0514 | 4.0467 | 4.0422 | 4.0372 |
| Voffs | 0.0005 | 0.0003 | 0.0004 | 0.0007 | 0.0006 | 0.0008 | 0.0007 | 0.0008 | 0.0004 |

| | | | | | | | | |
|---|---|---|---|---|---|---|---|---|
| Digital data DT | | | | | | | | |
| D3 | 1 | 1 | 1 | 1 | 1 | 1 | 1 | 1 |
| D2 | 0 | 0 | 0 | 0 | 1 | 1 | 1 | 1 |
| D1 | 0 | 0 | 1 | 1 | 0 | 0 | 1 | 1 |
| D0 | 0 | 1 | 0 | 1 | 0 | 1 | 0 | 1 |
| Non-inverting input terminal input voltage | | | | | | | | |
| V<1> | 4 | 4 | 4 | 4 | 4 | 4 | 4 | 4 |
| V<2> | 4.0736 | 4.0736 | 4.0736 | 4.0736 | 4.0736 | 4.0736 | 4.0736 | 4 |
| V<3> | 4 | 4 | 4 | 4 | 4 | 4 | 4 | 4 |
| V<4> | 4 | 4 | 4 | 4 | 4 | 4 | 4 | 4 |
| V<5> | 4 | 4 | 4 | 4 | 4 | 4 | 4 | 4 |
| V<6> | 4 | 4 | 4 | 4 | 4 | 4 | 4 | 4 |
| V<7> | 4.0736 | 4.0736 | 4.0736 | 4.0736 | 4 | 4 | 4 | 4 |
| V<8> | 4.0736 | 4.0736 | 4.0736 | 4.0736 | 4 | 4 | 4 | 4 |
| Tail current ratio (after correction) α=-0.05, β=0.18 | | | | | | | | |
| m<1> | 0.95 | 2 | 3.05 | 2 | 0.95 | 2 | 3.05 | 2 |
| m<2> | 1.82 | 1.82 | 1.82 | 1.82 | 1.82 | 1.82 | 0.95 | 1.82 |
| m<3> | 1.82 | 1.82 | 1.82 | 1.82 | 1.82 | 1.82 | 1.82 | 1.82 |
| m<4> | 1.82 | 1.82 | 1.82 | 1.82 | 1.82 | 1.82 | 1.82 | 1.82 |
| m<5> | 1.82 | 1.82 | 1.82 | 1.82 | 1.82 | 1.82 | 1.82 | 1.82 |
| m<6> | 1.82 | 1.82 | 1.82 | 1.82 | 1.82 | 1.82 | 1.82 | 1.82 |
| m<7> | 1.82 | 1.82 | 1.82 | 1.82 | 1.82 | 1.82 | 1.82 | 1.82 |
| m<8> | 3.05 | 2 | 0.95 | 2 | 1.82 | 2 | 1.82 | 1.82 |
| Output voltage | | | | | | | | |
| Vout (expected value) | 4.0322 | 4.0276 | 4.0230 | 4.0184 | 4.0138 | 4.0092 | 4.0046 | 4.0000 |
| Vout (SIM value) | 4.0325 | 4.0279 | 4.0233 | 4.0186 | 4.0138 | 4.0097 | 4.0053 | 4.0005 |
| Voffs | 0.0003 | 0.0003 | 0.0003 | 0.0002 | 0.0000 | 0.0005 | 0.0007 | 0.0005 |

FIG. 17D

| (M-K-1) bits | | (K+1) bits: (K=2) | | Output level |
|---|---|---|---|---|
| VA | VB | Non-inverting input terminal input voltage | Tail current ratio | |
| 0 | 8 | Combination selection for V<1>...V<$2^K$> | 3 level switching control | 1~8 |
| 8 | 16 | Same as above | Same as above | 9~16 |
| 16 | 24 | Same as above | Same as above | 17~24 |
| 24 | 32 | Same as above | Same as above | 25~32 |
| ⋮ | ⋮ | ⋮ | ⋮ | ⋮ |

FIG. 20

DIGITAL-TO-ANALOG CONVERTER, DATA DRIVER, AND DISPLAY DEVICE

CROSS-REFERENCE TO RELATED APPLICATION

This application claims the priority benefits of Japanese application no. 2023-011897, filed on Jan. 30, 2023. The entirety of the above-mentioned patent application is hereby incorporated by reference herein and made a part of this specification.

BACKGROUND

Technical Field

The disclosure relates to a digital-to-analog converter, a data driver including the digital-to-analog converter, and a display device including the data driver.

Description of Related Art

Currently, liquid crystal display devices or organic EL (Electroluminescence) display devices, etc. are the mainstream active matrix display devices. Such a display device is equipped with a display panel in which multiple data lines and multiple scanning lines are wired in an intersecting manner and display cells connected to the multiple data lines via pixel switches are arranged in a matrix, a data driver which supplies an analog voltage signal corresponding to the gradation level to the multiple data lines of the display panel, and a scanning driver which supplies a scanning signal for controlling on/off of each pixel switch to the multiple scanning lines of the display panel. The data driver includes a digital-to-analog converter that converts a video digital signal into an analog voltage corresponding to the brightness level and supplies an amplified voltage signal to each data line of the display panel.

A schematic configuration of the data driver will be described hereinafter.

The data driver includes, for example, a shift register, a data register latch, a level shifter, and the digital-to-analog converter.

The shift register generates multiple latch timing signals for selecting a latch in synchronization with a clock signal corresponding to a start pulse supplied from a display controller, and supplies the same to the data register latch. The data register latch captures the video digital data supplied from the display controller every predetermined S pieces (S is an integer of 2 or more) based on each of the latch timing signals supplied from the shift register, and supplies S video digital data signals to the level shifter. The level shifter performs level shifting processing to increase the signal amplitude for each of the S video digital data signals supplied from the data register latch, and supplies the obtained S level-shifted video digital data signals to the digital-to-analog converter.

The digital-to-analog converter includes a reference voltage group generation part, a decoder part, and an amplification part.

The reference voltage group generation part generates multiple reference voltages with voltage values different from each other and supplies the same to the decoder part. For example, the reference voltage group generation part supplies to the decoder part multiple divided voltages, obtained by dividing between at least two reference power supply voltages with a ladder resistor, as a reference voltage group.

The decoder part has S decoders provided respectively corresponding to each output of the data driver. Each of the decoders is supplied with the reference voltage group generated by the reference voltage group generation part, and receives the video digital data signal supplied from the level shifter, selects the reference voltage corresponding to this video digital data signal from the multiple reference voltages, and supplies the selected reference voltage to the amplification part.

The amplification part includes S differential amplifiers that individually amplify and output the reference voltage selected by each decoder of the decoder part.

With the above-described digital-to-analog converter, it is possible to increase the number of gradations (number of colors) of the brightness level that can be expressed as the number of reference voltages generated by the reference voltage group generation part increases. However, when the number of reference voltages generated by the reference voltage group generation part increases, the wiring area and the number of switch elements included in the decoder that selects the reference voltage also increase accordingly, and the chip size (manufacturing cost) of the data driver increases.

Therefore, a digital-to-analog converter has been proposed (see, for example, Patent Document 1), which uses a differential amplifier that is capable of outputting three or more voltage values by dividing (interpolating) two reference voltages selected based on the brightness level with a predetermined weighting, as the differential amplifier described above.

Patent Document 1 (Japanese Patent Application Laid-Open No. 2002-43944) proposes a negative feedback differential amplifier that outputs an output voltage with one of four voltage values obtained by dividing two reference voltages into four, and a digital-to-analog converter using this.

Such a differential amplifier includes four differential pairs which are respectively driven by the same tail current and whose output voltages are commonly fed back to a plurality of inverting input terminals, and are connected to their own non-inverting input terminals, and each of which receives one of two reference voltages with a 1:1:2 weighting. In the differential amplifier, one of the two reference voltages is input to the non-inverting input terminal of each differential pair according to the lower 2 bits of data of a digital data signal, and an output voltage having a voltage value of one of four voltage levels obtained by dividing the two reference voltages into four is output. Further, with the digital-to-analog converter including the differential amplifier, it is possible to output a voltage level four times (F−1), with respect to the number of voltages F of the reference voltage group, from the differential amplifier by selecting adjacent two reference voltages from the reference voltage group at every fourth gradation based on the upper bit group of data of the digital data signal. Thus, in the digital-to-analog converter described in Patent Document 1, the number of differential pairs of the differential amplifier is equal to the number of voltage levels obtained by dividing two input voltages (reference voltages).

Here, in order to save area of a multi-bit digital-to-analog converter, it is considered to increase the number of voltage levels by increasing the number of divisions of the two input voltages (reference voltages) utilizing the principle of the digital-to-analog converter described in Patent Document 1, thereby reducing the number of elements in the decoder for selecting the two input voltages (reference voltages). However, since the number of differential pairs of the differential amplifier increases in units of a power of 2, the number of elements in the differential amplifier increases significantly, which results in a problem that the area of the digital-to-analog converter cannot be saved as expected.

Therefore, a differential amplifier has been proposed which can increase the number of voltage levels of the output voltage with a small number of differential pairs by controlling the current ratio of the tail currents flowing through each differential pair (see, for example, Patent Document 2 (Japanese Patent Application Laid-Open No. 2006-174180)).

However, the differential amplifier described in Patent Document 2 has a problem that the output voltage signal has a large output error when the difference in magnitude between the tail currents flowing through the differential pairs increases.

Therefore, the disclosure provides a digital-to-analog converter that is capable of saving area without causing a decrease in output error, a data driver including the digital-to-analog converter, and a display device.

SUMMARY

A digital-to-analog converter according to the disclosure is configured to output an output voltage having one of $2^{(K+1)}$ voltage levels obtained by dividing a first voltage and a second voltage into $2^{(K+1)}$ according to (K+1) bits of digital data (K is a positive number of 1 or more). The digital-to-analog converter includes: a differential amplifier including a plurality of input terminals and configured to output a calculation result based on voltages respectively received at the plurality of input terminals from an output terminal of the differential amplifier as the output voltage; and a first decoder configured to receive the first voltage and the second voltage and assign and supply the first voltage or the second voltage to each of the plurality of input terminals of the differential amplifier based on the (K+1) bits of digital data. The differential amplifier includes: $2^K$ differential pairs each including an inverting input terminal to which the output voltage is commonly input, a non-inverting input terminal to which one of the voltages received at the plurality of input terminals is supplied as an input voltage, and an output pair, in which the output pairs are commonly connected, each of which is driven by a tail current received individually; an amplification stage configured to generate the output voltage by an amplification effect based on output of one or both of the output pair of each of the $2^K$ differential pairs; and a tail current control circuit configured to individually supply first to $2^{Kth}$ tail currents to the $2^K$ differential pairs and control, for each differential pair, first to $2^{Kth}$ current ratios of the first to $2^{Kth}$ tail currents to a reference current value based on the digital data. The tail current control circuit is configured to set each of the first to $2^{Kth}$ current ratios to a maximum value, a minimum value, or an intermediate value among three predetermined values and perform correction to increase one of the maximum value and the minimum value and decrease the other for the current ratio of the tail currents supplied to at least two predetermined differential pairs of the $2^K$ differential pairs.

A data driver according to the disclosure includes a plurality of the above digital-to-analog converters. The data driver is configured to convert each video digital data piece representing a brightness level of each pixel as a digital value into a plurality of the output voltages each having an analog voltage value by the plurality of digital-to-analog converters, and respectively supply a plurality of drive signals respectively having the plurality of output voltages to a plurality of data lines of a display panel.

A display device according to the disclosure includes: a display panel including a plurality of data lines to which a plurality of display cells are respectively connected; and a data driver including a plurality of the above digital-to-analog converters and configured to convert each video digital data piece representing a brightness level of each pixel as a digital value into a plurality of the output voltages each having an analog voltage value by the plurality of digital-to-analog converters, and respectively supply a plurality of drive signals respectively having the plurality of output voltages to the plurality of data lines of the display panel.

BRIEF DESCRIPTION OF THE DRAWINGS

FIG. 2A is a diagram showing the input voltage setting specifications of the digital-to-analog converter 100_1.

FIG. 2B is a diagram showing the basic specifications of the tail current ratio of the digital-to-analog converter 100_1.

FIG. 4A is a diagram showing an example of the basic specifications (K=1) of the digital-to-analog converter 100_2.

FIG. 4B is a diagram showing an example of the corrected specifications (K=1) of the digital-to-analog converter 100_2.

FIG. 8A is a diagram showing an example of the basic specifications (K=2) of the digital-to-analog converter 100_3.

FIG. 8B is a diagram showing an example of the corrected specifications (K=2) of the digital-to-analog converter 100_3.

FIG. 11A is a diagram showing a modified example of the basic specifications (K=2) shown in FIG. 8A.

FIG. 11B is a diagram showing the corrected specifications with respect to the basic specifications shown in FIG. 11A.

FIG. 14A is a diagram showing a part of the basic specifications (K=3) of the digital-to-analog converter 100_4.

FIG. 14B is a diagram showing other parts of the basic specifications (K=3) of the digital-to-analog converter 100_4.

FIG. 14C is a diagram showing a part of the corrected specifications (K=3) of the digital-to-analog converter 100_4.

FIG. 14D is a diagram showing other parts of the corrected specifications (K=3) of the digital-to-analog converter 100_4.

FIG. 17A is a diagram showing a part of a modified example of the basic specifications (K=3) shown in FIG. 14A.

FIG. 17B is a diagram showing other parts of the modified example of the basic specifications (K=3) shown in FIG. 14B.

FIG. 17C is a diagram showing the corrected specifications with respect to the basic specifications shown in FIG. 17A.

FIG. 17D is a diagram showing the corrected specifications with respect to the basic specifications shown in FIG. 17B.

FIG. 20 is a diagram showing an example of specifications of the digital-to-analog converter 100_5.

DESCRIPTION OF THE EMBODIMENTS

A digital-to-analog converter according to the disclosure includes: a differential amplifier that includes a plurality of differential pairs receiving input voltages received at a plurality of input terminals and fed-back output voltages at respective inverting input terminals and non-inverting input terminals; and a decoder that assigns and supplies one of first and second voltages to each of the plurality of input terminals of the differential amplifier based on the digital data. The differential amplifier includes a tail current control circuit that supplies tail current to the plurality of differential pairs described above and variably controls tail current ratios of the plurality of differential pairs based on predetermined bits of the digital data. This makes it possible to increase the number of voltage levels of the output voltage with a small number of differential pairs, and to save the area.

Furthermore, the tail current control circuit of the digital-to-analog converter according to the disclosure has a basic configuration that sets each of the current ratios of the tail currents supplied to the plurality of differential pairs to a maximum value, a minimum value, or an intermediate value among three predetermined values, and performs correction to increase one of the maximum value and the minimum value and decrease the other for the current ratio of the tail currents supplied to at least two predetermined differential pairs. This makes it possible to suppress an error in the output voltage that occurs due to variable control of the current ratio of the tail currents.

Therefore, according to the disclosure, it is possible to save the area of the digital-to-analog converter without causing a decrease in output error.

First Embodiment

Figure 1:
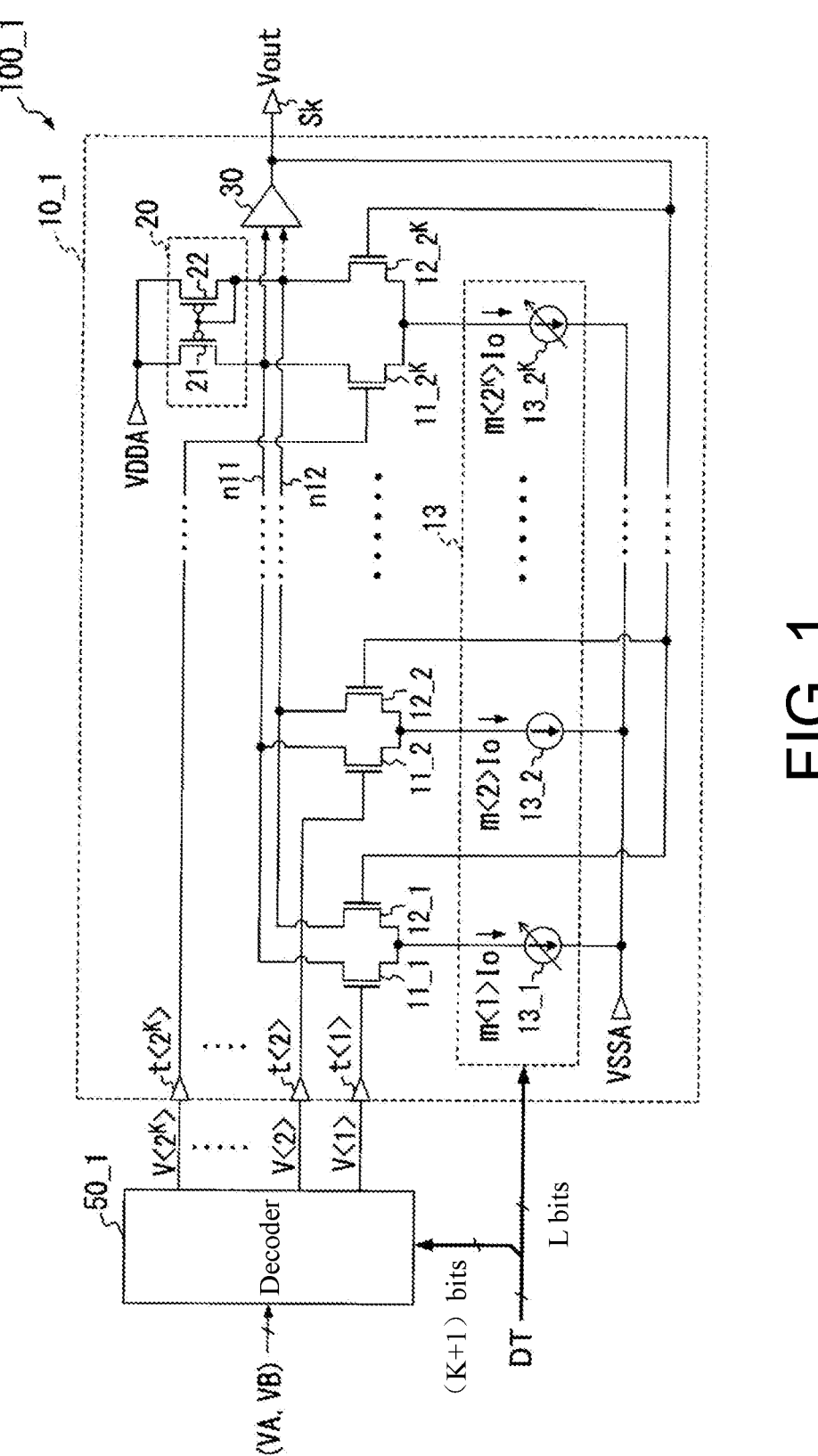
FIG. 1 is a circuit diagram showing the configuration of the digital-to-analog converter 100_1 as the first embodiment of the disclosure.

FIG. 1 is a circuit diagram showing the configuration of a digital-to-analog converter 100_1 as the first embodiment of the disclosure.

As shown in FIG. 1, the digital-to-analog converter 100_1 includes a decoder 50_1 and a differential amplifier 10_1 that includes $2^K$ (K is an integer of 1 or more) differential pairs, and converts a digital data signal DT of (K+1) bits into an output voltage signal Vout having an analog voltage level.

The decoder 50_1 receives the digital data signal DT and two voltages VA and VB having different voltage values. The decoder 50_1 selects a combination of assigning the two voltages VA and VB respectively to input terminals t<1> to t<$2^K$> of the differential amplifier 10_1 based on the digital data signal DT. The decoder 50_1 supplies input voltages V<1> to V<$2^K$> each indicating one of the voltages VA and VB according to this selected combination to the input terminals t<1> to t<$2^K$>, which are the non-inverting input terminals of the differential amplifier 10_1.

The differential amplifier 10_1 amplifies one voltage level corresponding to the digital data signal DT of (K+1) bits, among $2^{(K+1)}$ voltage levels obtained by dividing the voltages VA to VB into $2^{(K+1)}$ through linear approximation, and outputs the amplification result as an output voltage signal Vout. The differential amplifier 101 includes $2^K$ differential pairs (11_1, 12_1) to (11_2$^K$, 12_2$^K$) of the same conductivity type (N-channel type in FIG. 1), each of which is supplied with a tail current and whose output pairs are commonly connected, a tail current control circuit 13, a current mirror circuit 20, and an amplification stage 30.

The current mirror circuit 20 includes P-channel type transistors 21 and 22 whose gates are connected to each other and which have the same size. The high potential power supply voltage VDDA is applied to the source of each of the transistors 21 and 22. Further, the drain of the transistor 21 is connected to the node n11, and the gate and drain of the transistor 22 are connected to the node n12. The nodes n11 and n12 are respectively connected to the output pairs of the differential pairs (11_1, 12_1) to (11_2$^K$, 12_2$^K$).

With such a configuration, the current mirror circuit 20 operates as a common load for the differential pairs (11_1, 12_1) to (11_2$^K$, 12_2$^K$).

The output voltage signal Vout is fed back to the inverting input terminal of each of the differential pairs (11_1, 12_1) to (11_2$^K$, 12_2$^K$), that is, the gate of each of the N-channel type transistors (also referred to as differential pair transistors) 12_1 to 12_2$^K$. The non-inverting input terminals of the differential pairs (11_1, 12_1) to (11_2$^K$, 12_2$^K$), that is, the gates of the N-channel type transistors (also referred to as differential pair transistors) 11_1 to 11_2$^K$ are connected to the input terminals t<1> to t<2$^K$>. That is, the input voltages V<1> to V<2$^K$> each having the voltage VA or VB are supplied to the gates of the differential pair transistors 11_1 to 11_2$^K$.

The transistors 11_1 to 11_2$^K$ have the same transistor characteristics, and the respective drains are commonly connected through the node n11. The transistors 12_1 to 12_2$^K$ have the same transistor characteristics, and the respective drains are commonly connected through the node n12. That is, the 2$^K$ differential pairs (11_1, 12_1) to (11_2$^K$, 12_2$^K$) have a parallel connection configuration in which the output pairs are commonly connected. The sources of the transistors of the differential pairs (11_1, 12_1) to (11_2$^K$, 12_2$^K$) are connected to each other, and each is individually connected to the tail current control circuit 13.

Hereinafter, the operation will be described assuming that the differential pair transistors forming each of the differential pairs (11_1, 12_1) to (11_2$^K$, 12_2$^K$) have equivalent characteristics. In other words, in an actual configuration, for example, multiple differential pairs with common input may be replaced with a single differential pair in which the size of the differential pair transistors is changed. However, for convenience, it is assumed that the characteristics of the differential pair transistors of each differential pair are the same, and the disclosure also includes an equivalent configuration. As the simplest example, the differential pair transistors of the differential pairs (11_1, 12_1) to (11_2$^K$, 12_2$^K$) all have the same size.

The tail current control circuit 13 includes current sources 13_1 to 13_2$^K$ that are individually connected between the sources of the differential pairs (11_1, 12_1) to (11_2$^K$, 12_2$^K$) and the low potential power supply voltage VSSA. The current sources 13_1 to 13_2$^K$ generate tail currents to be supplied to the sources of the differential pairs (11_1, 12_1) to (11_2$^K$, 12_2$^K$).

It should be noted that two predetermined current sources 13_1 and 13_2$^K$ among the current sources 13_1 to 13_2$^K$ are variable current sources while the other current sources are fixed current sources.

In other words, in the current sources 13_1 and 13_2$^K$ which are variable current sources, the tail current ratio of the tail currents respectively flowing through the differential pairs (11_1, 12_1) and (11_2$^K$, 12_2$^K$) is controlled based on the lower L bits (L is an integer of 2 or more) of the digital data signal DT. On the other hand, the current sources other than the two current sources 13_1 and 13_2$^K$ mentioned above are controlled so that the tail current ratio of the tail currents flowing through the differential pair respectively connected thereto is the same and fixed.

It is also possible to change all of the current sources 13_1 to 13_2$^K$ in the tail current control circuit 13 to variable current sources. However, as a specific example for easy control, at least two predetermined current sources are variable current sources. Further, in order to maintain the slew rate (amount of voltage change per unit time) constant when the output voltage signal Vout of the differential amplifier 10_1 changes in voltage, regardless of the voltage level, each tail current ratio is controlled so that the sum or average of the tail current ratios generated by the current sources 13_1 to 13_2$^K$ is constant or substantially constant regardless of the voltage level.

The amplification stage 30 outputs a signal, obtained by an amplification effect based on the voltage generated from one or both of the commonly connected output pairs (nodes n11, n12) of the 2$^K$ differential pairs, as the output voltage signal Vout via the output terminal Sk.

The amplification operation of the differential amplifier 10_1 shown in FIG. 1 will be described below.

For convenience, the set currents of the current sources 13_1 to 13_2$^K$ that supply tail currents to the differential pairs (11_1, 12_1) to (11_2$^K$, 12_2$^K$) are respectively defined as m<1>Io to m<2$^K$>Io. Here, Io is a reference current value that serves as a reference, and each of m<1> to m<2$^K$> is a current ratio (tail current ratio) of the tail currents flowing through each of the differential pairs (11_1, 12_1) to (11_2$^K$, 12_2$^K$). In other words, the tail current ratios m<1> to m<2$^K$> are coefficients for the reference current value Io, and are set to values that satisfy the following formula (1) so as to keep the total current ratio substantially constant.

$$m<1> + m<2> + \ldots + m<2^K> = 2^K \tag{1}$$

For convenience of calculation, where 2$^K$=n, $$m<1> + m<2> + \ldots + m<n> = n \tag{1a}$$

In addition, for the i$^{th}$ differential pair of n(=2$^K$), where the current of the differential pair transistor on the non-inverting input terminal side is Iai and the current of the differential pair transistor on the inverting input terminal side is Ibi, the following formulas (2) and (3) are satisfied.

$$Iai = Is + gmi \cdot (V<i> - Vs) \tag{2}$$

$$Ibi = Is + gmi \cdot (Vout - Vs) \tag{3}$$

It should be noted that Is and Vs represent predetermined operating points within a voltage range that can be linearly approximated on the IV characteristic curve of the differential pair transistor, and V<i> and Vout represent voltages near Vs (within the range of linear approximation). Furthermore, the mutual conductance gm at the operating point of the differential pair transistors on the non-inverting input terminal side and the inverting input terminal side is expressed as gmi.

Here, where the current weighting ratio of the current supplied to the i$^{th}$ differential pair is m<i>, the above formulas (2) and (3) are expressed by the following formulas (4) and (5).

$$m<i> Iai = m<i> Is + gmim<i> \cdot (V<i> - Vs) \tag{4}$$

$$m<i> Ibi = m<i> Is + gmim<i> \cdot (Vout - Vs) \tag{5}$$

Then, the following formula (6) is obtained by taking the difference between formulas (4) and (5).

$$m < i > (Iai\text{-}Ibi) = gmim < i > (V < i >\text{-}Vout) \qquad (6)$$

Furthermore, assuming that the fluctuation of the operating point with respect to the fluctuation of the current weighting ratio in the current supplied to each differential pair (arbitrary i value) is also within the range of linear approximation, gm can be approximated to be constant (gmi=gm).

By adding the left side of the above formula (6) and adding the right side for i=1 to n, the following formulas (7) and (8) are obtained.

$$\text{Left side} = \qquad (7)$$

$$(m < 1 > Ia_1 + \ldots + m < n > Ia_n) - (m < 1 > Ib_1 + \ldots + m < n > Ib_n)$$

$$\text{Right side} = g_m((m < 1 > V < 1 > + \ldots + m < n > V < n >) - \qquad (8)$$

$$(m < 1 > + \ldots + m < n >)Vout)$$

Here, the left side mentioned above is the difference between the total currents of the differential pair transistors on the non-inverting input terminal side and the differential pair transistors on the inverting input terminal side, and corresponds to the relationship between the input current and output current in the current mirror circuit 20. At this time, since the sum of the currents flowing through the differential pair transistors on the non-inverting input terminal side and the sum of the currents flowing through the differential pair transistors on the inverting input terminal side are mutually equal, the difference between the total currents is zero, that is, the left side mentioned above is zero.

On the other hand, the coefficient (m<1>+ . . . +m<n>) of the output voltage signal Vout on the right side mentioned above becomes a constant value n(=2$^K$) according to formula (1a), and are expressed as the following formulas (9) and (10) based on formulas (7) and (8).

$$Vout = (m < 1 > V < 1 > + \ldots + m < n > V < n >)/n \qquad (9)$$

Here, when n is returned to 2$^K$, the output voltage signal Vout is expressed by the following formula.

$$Vout = (m < 1 > V < 1 > + \ldots + m < 2^K > V < 2^K >) \qquad (10)$$

$$/(m < 1 > + \ldots + m < 2^K >)$$

According to the above, the output voltage signal Vout of the differential amplifier 10_1 shown in FIG. 1 becomes a weighted average value of the integrated value of input voltage weighting and tail current ratio weighting with respect to the input voltage of the non-inverting input terminal of each differential pair, as shown in formula (10).

In formula (10), the average of the tail current ratios m<1> to m<2$^K$> is a predetermined reference value, and the total tail current ratio (or average) is assumed to be substantially constant. It should be noted that the predetermined reference value can be set arbitrarily, and in the description of the embodiments below, the reference value is set to 2.

Therefore, the output voltage signal Vout expressed by formula (10) can take a multi-value voltage that equally divides the voltages VA to VB by the combination of the two voltages (VA, VB) supplied to the non-inverting input terminal of each differential pair and the combination of the tail current ratio of each differential pair. Among these, a voltage level that almost equally divides the voltages VA to VB into 2$^{(K+1)}$ can be generated by the optimal combination of the two voltages (VA, VB) and combination of the tail current ratio.

Hereinafter, an example of the specifications of the digital-to-analog converter 100_1 shown in FIG. 1 will be described with reference to FIG. 2A and FIG. 2B.

FIG. 2A is a diagram showing an example of the basic specifications of the tail current ratios m<1> to m<2$^K$> of the differential pairs (11_1, 12_1) to (11_2$^K$, 12_2$^K$), which are set corresponding to the input voltage setting specifications representing the contents of the input voltages V<1> to V<2$^K$> that the decoder 501 supplies to the non-inverting input terminals of the differential pairs (11_1, 12_1) to (11_2$^K$, 12_2$^K$) based on the digital data signal DT, and each digital code of the digital data signal DT.

In the specifications of FIG. 2A, the output voltage signal Vout has a voltage level that divides the voltages VA to VB into 2$^{(K+1)}$ and the 2$^{(K+1)}$ voltage levels excluding the voltage VA correspond to the codes of the (K+1) bits D0 to DK of the digital data signal DT.

For example, when the (K+1) bits D0 to DK in the digital data signal DT represent the maximum value (all bits are at logic level 1), only the voltage VB is assigned as each of the input voltages V<1> to V<2$^K$>.

Furthermore, in the specifications shown in FIG. 2A, unless the bit represents the maximum value as described above (all bits are at logic level 1), the voltage VB is assigned as the input voltage V<1> and the voltage VA is assigned as the input voltage V<2$^K$> regardless of the contents of the bits D0 to DK. Further, in the specifications shown in FIG. 2A, unless the bit represents the maximum value as described above (all bits are at logic level 1), the voltage VB is assigned as the input voltage V<1> and the voltage VA is assigned as the input voltage V<2$^K$> regardless of the contents of the bits D0 to D(K+1). Further, in the specifications shown in FIG. 2A, each of the input voltages V<2> to V<2$^K$–1> is assigned the voltage VA or VB for each digital code represented by the bits D0 to DK.

Further, in the basic specifications shown in FIG. 2A, the tail current ratios m<1> to m<2$^K$> of the differential pairs, excluding the two differential pairs (11_1, 12_1) and (11_2$^K$, 12_2$^K$) from the differential pairs (11_1, 12_1) to (11_2$^K$, 12_2$^K$), are controlled to be fixed at the reference value "2" regardless of each digital code of the digital data signal DT.

On the other hand, the tail current ratios of the differential pairs (11_1, 12_1) and (11_2$^K$, 12_2$^K$) are variably controlled to one of "1", "2", and "3" based on the lower two bits of the digital data signal DT. Specifically, the tail current ratios of the differential pairs (11_1, 12_1) and (11_2$^K$, 12_2$^K$) are controlled to "1" or "3" when outputting an odd-numbered voltage level from the voltage VA or voltage VB among 2$^{(K+1)}$ voltage levels in the output voltage signal Vout, and are controlled to "2" when outputting an even-numbered voltage level from the voltage VA or voltage VB. The input voltage V<1> having the voltage VA and the input voltage V<2$^K$> having the voltage VB are respectively supplied to the non-inverting input terminals of the two differential pairs (11_1, 12_1) and (11_2$^K$, 12_2$^K$) that are controlled to be variable, as shown in FIG. 2A. It should be noted that the two differential pairs with variably controlled tail current ratios can be replaced with other differential pairs according to the digital code of the digital data signal DT.

Here, the values of the input voltages V<1> to V<$2^K$> supplied to the non-inverting input terminals of the differential pairs ($11\_1$, $12\_1$) to ($11\_2^K$, $12\_2^K$) and the tail current ratios m<1> to m<$2^K$> shown in the basic specifications of FIG. 2A are determined so that the $2^{(K+1)}$ voltage levels of the output voltage signal Vout corresponding to the digital codes indicated by the digital data signal DT satisfy the above formula (10), that is, in line with the characteristics obtained by linearly interpolating between the voltages VA and VB.

However, in the case where the difference between the tail currents flowing through the differential pairs ($11\_1$, $12\_1$) to ($11\_2^K$, $12\_2^K$) becomes large, that is, in the case where the difference between the tail current ratios becomes large, when the digital-to-analog converter $100\_1$ is actually operated using the tail current ratios m<1> to m<$2^K$> in accordance with the basic specifications of FIG. 2A, an output error occurs in the voltage level of the output voltage signal Vout. The reason for this is that the portion where the actual IV characteristic curve of the differential pair transistor is a quadratic curve is linearly approximated, and when the difference between the tail current ratios increases, the actual operating point deviates from the linear approximation.

For example, the tail current ratios m<1> and m<$2^K$> corresponding to the digital code [0, . . . , 0, 0] indicated by the bits D0 to DK of the digital data signal DT in FIG. 2A are "1" and "3", respectively. Further, the tail current ratios m<1> and m<$2^K$> corresponding to the digital code [0, . . . , 0, 1] are both the reference value "2". In addition, the tail current ratios m<1> and m<$2^K$> corresponding to the digital code [0, . . . , 1, 0] are "3", which is 1.5 times the reference value, and "1", which is 0.5 times the reference value, respectively.

At this time, when the tail current ratios m<1> and m<$2^K$> are "3" and "1", or "1" and "3", respectively, the difference between the tail current ratios becomes larger than when both of the tail current ratios are the reference value "2", and as a result, the amount of variation in mutual conductance gm of each differential pair transistor becomes large. Thus, an output error occurs in the output voltage signal Vout, which is larger or smaller than the expected value according to the characteristics obtained by linearly approximating the voltages VA and VB as described above.

For example, when the tail current ratio m<1> shown in FIG. 2A is "3" and the tail current ratio m<$2^K$> is "1", an output error occurs in the output voltage signal Vout, in which the voltage level is larger than the expected value according to the linear approximation characteristics described above. Further, when the tail current ratio m<1> shown in FIG. 2A is "1" and the tail current ratio m<$2^K$> is "3", an output error occurs in the output voltage signal Vout, in which the voltage level is smaller than the expected value according to the linear approximation characteristics described above.

Therefore, in order to suppress such an output error, the following correction is made to the tail current ratios m<1> to m<$2^K$> shown in the basic specifications of FIG. 2A.

FIG. 2B is a diagram showing an example of the corrected specifications of the tail current ratios m<1> to m<$2^K$>, which are obtained by correcting the tail current ratios shown in the basic specifications of FIG. 2A.

In the example shown in FIG. 2B, for the tail current ratios m<2> to m<$2^K$–1>, a new tail current ratio is set by subtracting a predetermined correction value β (β is a rational number excluding zero) from the basic tail current ratio "2", regardless of the digital code.

On the other hand, for the remaining tail current ratios m<1> and m<$2^K$>, when "1" is assigned as the basic tail current ratio, as shown in FIG. 2B, a new tail current ratio is set by subtracting a predetermined correction value α (α is a rational number excluding zero) from this "1". Further, when "3" is assigned as the basic tail current ratio, as shown in FIG. 2B, a new tail current ratio is set by adding the predetermined correction value α to "3". It should be noted that the correction values α and β can take positive or negative values.

That is, in the example shown in FIG. 2B, for the tail current ratio "1" smaller than the intermediate tail current ratio "2" and the tail current ratio "3" larger than the tail current ratio "2" among the tail current ratios "1", "2", and "3" shown in the basic specifications of FIG. 2A, correction is made to decrease one and increase the other. In other words, the tail current ratios are corrected to cause an output error in the opposite direction for an output error that occurs in the direction in which the voltage level of the output voltage signal Vout is smaller than the expected value and an output error that occurs in the direction in which the voltage level is larger, thereby offsetting the output error generated in the output voltage signal Vout. It should be noted that the optimal values of the correction values α and β differ depending on the IV characteristics of the differential pair transistors and the voltage difference range between the voltages VA and VB.

Therefore, by adopting the tail current ratios m<1> to m<$2^K$> as shown in the basic specifications of FIG. 2A with the correction shown in FIG. 2B, the output error in the output voltage signal Vout due to variation in mutual conductance of the differential pair transistors is reduced.

Accordingly, making the correction as shown in FIG. 2B to the basic specifications shown in FIG. 2A and adopting the corrected tail current ratio as the tail current ratio flowing through each differential pair included in the digital-to-analog converter $100\_1$ shown in FIG. 1 makes it possible to save area of the digital-to-analog converter without causing a decrease in output error.

It should be noted that the current mirror circuit 20 included in the differential amplifier $10\_1$ is not limited to the configuration shown in FIG. 1, and any current mirror circuit such as a cascode type may be employed.

In addition, instead of using the N-channel type differential pairs shown in FIG. 1, the differential pairs ($11\_1$, $12\_1$) to ($11\_2^K$, $12\_2^K$) included in the differential amplifier $10\_1$ may use P-channel type differential pairs or dual-conductivity type differential pairs that form pairs with N-channel type transistors and P-channel type transistors.

Furthermore, although FIG. 2A and FIG. 2B illustrate an example of specifications in which each digital code of (K+1) bits is assigned to $2^{(K+1)}$ voltage levels up to the voltage VB excluding the voltage VA among the voltage levels obtained by dividing the voltages VA to VB into $2^{(K+1)}$, the specifications may be replaced with those that assign each digital code of (K+1) bits to $2^{(K+1)}$ voltage levels that include the voltage VA and exclude the voltage VB.

For convenience, each of the following embodiments illustrates a configuration example of a differential amplifier including $2^K$ N-channel type differential pairs similar to FIG. 1 and an example of specifications in which each digital code of (K+1) bits is assigned to $2^{(K+1)}$ voltage levels excluding the voltage VA similar to FIG. 2A and FIG. 2B, but it goes without saying that the differential amplifier as described above may be partially replaced and the assignment of the digital code may also be replaced.

Second Embodiment

Figure 3:
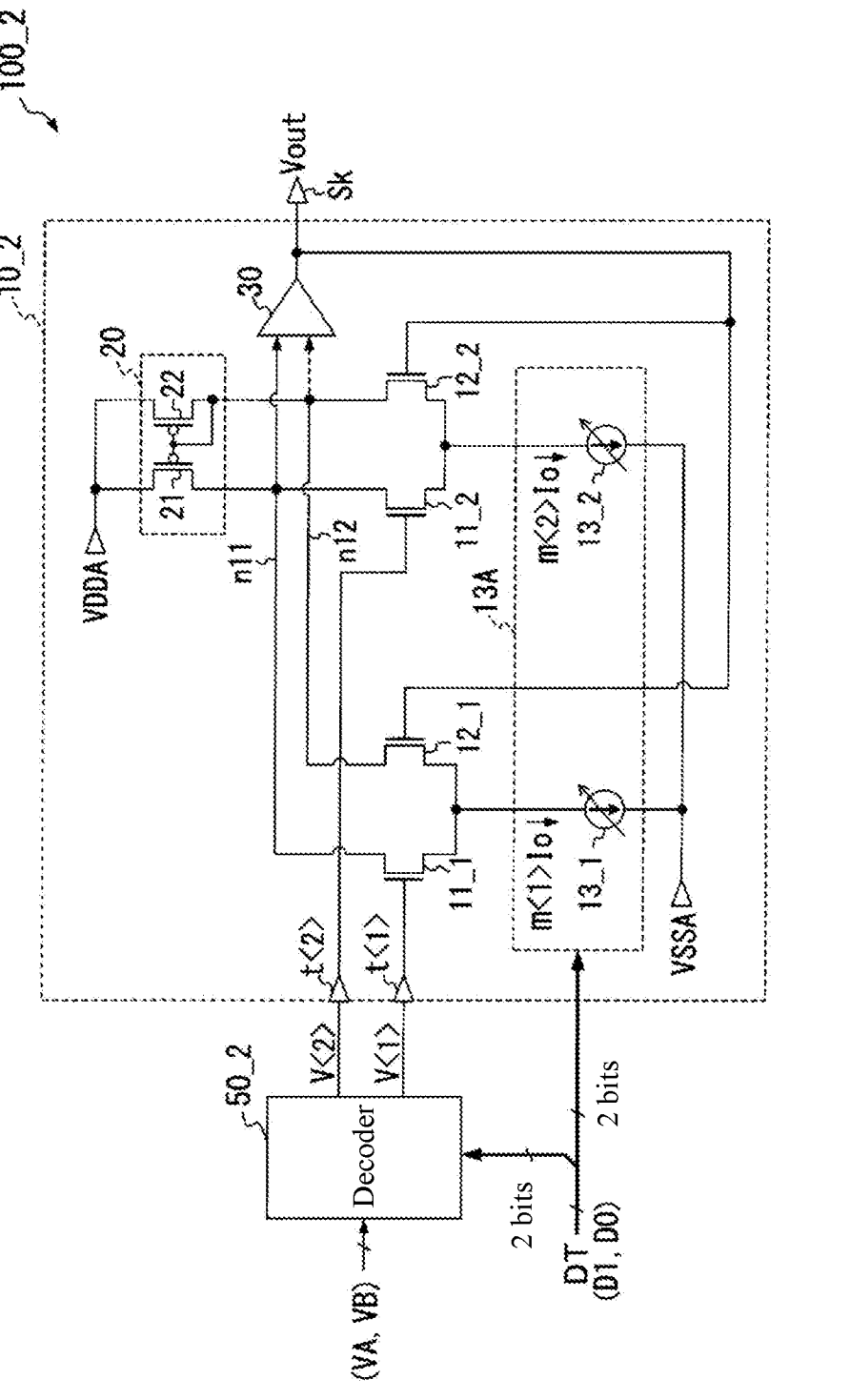
FIG. 3 is a circuit diagram showing the configuration of the digital-to-analog converter 100_2 as the second embodiment of the disclosure.

FIG. 3 is a circuit diagram showing the configuration of a digital-to-analog converter 100_2 according to the second embodiment of the disclosure.

The digital-to-analog converter 100_2 receives a 2-bit digital data signal DT, converts the digital data signal DT into an output voltage signal Vout, and outputs. The digital-to-analog converter 100_2 includes a decoder 50_2 and a differential amplifier 10_2.

The decoder 50_2 receives two voltages VA and VB having different voltage values together with the 2-bit (D0, D1) digital data signal DT. The decoder 50_2 selects a combination of assigning the two voltages VA and VB respectively to input terminals t<1> and t<2> of the differential amplifier 102 based on the digital data signal DT. The decoder 50_2 supplies input voltages V<1> and V<2> each indicating one of the voltages VA and VB according to this selected combination to the input terminals t<1> and t<2>, which are the non-inverting input terminals of the differential amplifier 10_2.

The differential amplifier 10_2 amplifies one voltage level corresponding to the 2-bit digital data signal DT, among four voltage levels obtained by dividing the voltages VA to VB through linear approximation, and outputs the amplification result as the output voltage signal Vout. The differential amplifier 102 includes two differential pairs (11_1, 12_1) and (11_2, 12_2) of the same conductivity type (N-channel type in FIG. 3), each of which is supplied with a tail current and whose output pairs are commonly connected, a tail current control circuit 13A, a current mirror circuit 20, and an amplification stage 30.

The current mirror circuit 20 includes P-channel type transistors 21 and 22 whose gates are connected to each other and which have the same size. The high potential power supply voltage VDDA is applied to the source of each of the transistors 21 and 22. Further, the drain of the transistor 21 is connected to the node n11, and the gate and drain of the transistor 22 are connected to the node n12. The nodes n11 and n12 are respectively connected to the output pairs of the differential pairs (11_1, 12_1) and (11_2, 12_2). With such a configuration, the current mirror circuit 20 operates as a common load for the differential pairs (11_1, 12_1) and (11_2, 12_2).

The output voltage signal Vout is fed back to the inverting input terminal of each of the differential pairs (11_1, 12_1) and (11_2, 12_2), that is, the gate of each of the N-channel type transistors (also referred to as differential pair transistors) 12_1 and 12_2. The non-inverting input terminals of the differential pairs (11_1, 12_1) and (11_2, 12_2), that is, the gates of the N-channel type transistors (also referred to as differential pair transistors) 11_1 and 11_2 are connected to the input terminals t<1> and t<2>. That is, the input voltages V<1> and V<2> each having the voltage VA or VB are supplied to the gates of the differential pair transistors 11_1 and 11_2.

The transistors 11_1 and 11_2 have the same transistor characteristics, and the respective drains are commonly connected through the node n11. The transistors 12_1 and 12_2 have the same transistor characteristics, and the respective drains are commonly connected through the node n12. That is, the differential pairs (11_1, 12_1) and (11_2, 12_2) have a parallel connection configuration in which the output pairs are commonly connected. The sources of the transistors of the differential pairs (11_1, 12_1) and (11_2, 12_2) are connected to each other, and each is individually connected to the tail current control circuit 13A.

The tail current control circuit 13A includes a current source 13_1 that generates a tail current to flow through the differential pair (11_1, 12_1), and a current source 13_2 that generates a current to flow through the differential pair (11_2, 12_2). The current source 13_1 is connected between the tails of the differential pair (11_1, 12_1), that is, the sources of the differential pair transistors, and the supply line of the low potential power supply voltage VSSA (for example, 0 V). The current source 13_2 is connected between the tails of the differential pair (11_2, 12_2), that is, the sources of the differential pair transistors, and the supply line of the low potential power supply voltage VSSA (for example, 0 V).

The current sources 13_1 and 13_2 are variable current sources, and the current ratio of the tail currents flowing through the current sources is variable based on the digital data signal DT. With such a configuration, the current source 13_1 supplies a current m<1>Io obtained by multiplying the tail current ratio m<1> set by the digital data signal DT by a reference current value Io to the differential pair (11_1, 12_1) as a tail current. The current source 13_2 supplies a current m<2>Io obtained by multiplying the tail current ratio m<2> set by the digital data signal DT by the reference current value Io to the differential pair (11_2, 12_2) as a tail current.

The digital-to-analog converter 100_2 has two differential pairs included in the differential amplifier 101 of the digital-to-analog converter 100_1 shown in FIG. 1, that is, K=1, and the basic operation is the same as the digital-to-analog converter 100_1 described above.

A specific form of correction for the tail current ratio in the digital-to-analog converter 100_2 will be described below with reference to FIG. 4A, FIG. 4B, and FIG. 5A to FIG. 5C.

FIG. 4A is a diagram showing the basic specifications of the digital-to-analog converter 100_2.

The basic specifications shown in FIG. 4A represent a relationship between a combination of two voltages (VA, VB) that the decoder 50_2 assigns to the input voltages V<1> and V<2> supplied to the 2-system non-inverting input terminals of the differential amplifier 10_2 based on the 2-bit (D1, D0) digital data signal DT, the tail current ratios m<1> and m<2>, and the output voltage signal Vout. It should be noted that an example of specifications is shown in which each digital code of 2 bits (D1, D0) is assigned to four voltage levels excluding the voltage VA among the voltage levels obtained by dividing the voltage VA and the voltage VB into four.

The tail current ratios m<1> and m<2> in FIG. 4A correspond to the tail current ratios m<1> and m<2$^K$> to be variably controlled in FIG. 2A.

Further, in the basic specifications shown in FIG. 4A, the two voltages (VA, VB) are set to voltage levels (4.08 volts, 4.00 volts).

Here, the expected value of the output voltage signal Vout output from the differential amplifier 10_2 is expressed by the following linear approximation formula.

$$Vout - (m<1> V<1> + m<2> V<2>)/(m<1> + m<2>)$$

Therefore, the expected value of the output voltage signal Vout for each digital code of the digital data signal DT when the voltage levels 4.00 to 4.08 are divided into four through linear approximation is as follows, as shown in FIG. 4A:

4.00 volts,
4.02 volts,
4.04 volts,
4.06 volts,
4.08 volts.

Figure 5A:
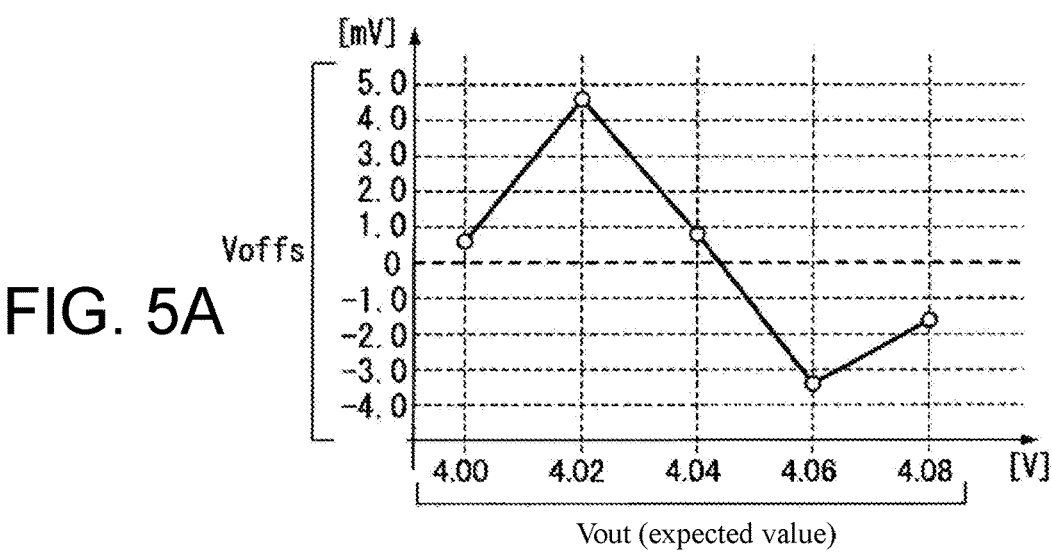
FIG. 5A is a diagram showing an example of the output error characteristics in the basic specifications of the digital-to-analog converter 100_2.

The voltage level (SIM value) of the output voltage signal Vout for each digital code of the digital data signal DT obtained by actually operating the differential amplifier 10_2 using the input voltages V<1> and V<2> and the tail current ratios m<1> and m<2> shown in FIG. 4A is as follows:

4.000664 volts,
4.024739 volts,
4.040831 volts,
4.056696 volts,
4.080660 volts. Moreover, the output error Voffs obtained by subtracting the expected value of the output voltage signal Vout from the voltage level (SIM value) of the output voltage signal Vout for each expected value of the output voltage signal Vout in FIG. 4A is shown in FIG. 5A. It should be noted that in FIG. 5A, the inherent output error of the differential amplifier uniformly includes an output error of about plus 0.7 millivolts with respect to each expected value.

That is, as shown in FIG. 4A and FIG. 5A, the output voltage signal Vout has an output error Voffs of about plus or minus 4 millivolts, larger or smaller than each expected value.

Figure 5B:
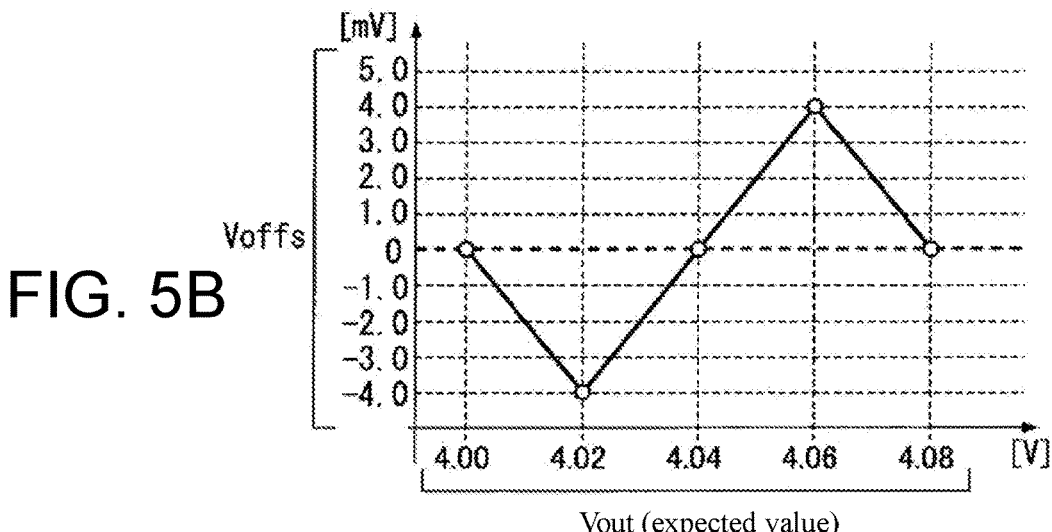
FIG. 5B is a diagram showing an example of the error correction characteristics with respect to the basic specifications in the digital-to-analog converter 100_2.

Therefore, when an output error occurs in which the voltage level of the output voltage signal Vout becomes smaller (larger) than the expected value for each expected value, correction is applied to the tail current ratios m<1> and m<2> shown in FIG. 4A to forcibly generate an output error as shown in FIG. 5B, which makes the voltage level larger (smaller) than the expected value.

Specifically, as shown in FIG. 4B, "0.2" is subtracted as the correction value α from the tail current ratio "1" shown in the basic specifications of FIG. 4A, and "0.2" is added as the correction value α to the tail current ratio "3". Further, FIG. 5B shows the output error Voffs with respect to the calculation result of the approximate formula of the output voltage signal Vout using the corrected tail current ratio. It can be seen from FIG. 5B that the correction of the tail current ratio described above causes an output error in the opposite direction to the output error in the voltage level (SIM value) of the output voltage signal Vout shown in FIG. 5A.

As a result, the voltage level (SIM value) of the output voltage signal Vout for each digital code of the digital data signal DT obtained by actually operating the differential amplifier 10_2 using the input voltages V<1> and V<2> and the corrected tail current ratios m<1> and m<2> shown in FIG. 4B is as follows:

4.000664 volts,
4.020956 volts,
4.040823 volts,
4.060506 volts,
4.080660 volts. Moreover, the output error Voffs obtained by subtracting the expected value of the output voltage signal Vout from the voltage level (SIM value) of the output voltage signal Vout for each expected value of the output voltage signal Vout in FIG. 4B is shown in FIG. 5C.

Figure 5C:
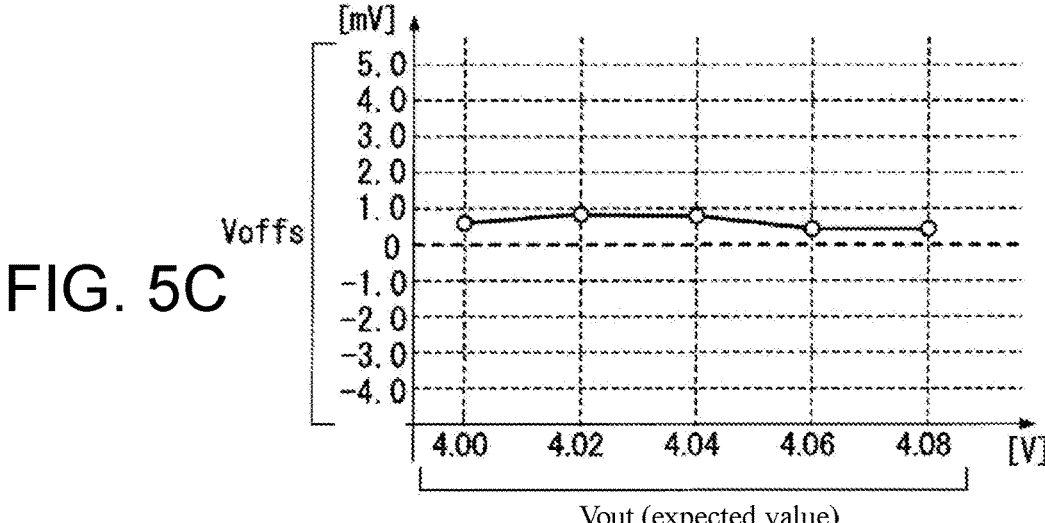
FIG. 5C is a diagram showing an example of the output error characteristics after error correction with respect to the basic specifications in the digital-to-analog converter 100_2.

That is, as shown in FIG. 4B and FIG. 5C, the output error Voffs for each expected value in the output voltage signal Vout becomes sufficiently smaller than the output error in FIG. 4A and FIG. 5A before the tail current ratio is corrected. In other words, the margin of error with respect to the expected value decreases from about 4 millivolts before correction to about 0.2 millivolts.

Figure 6A:
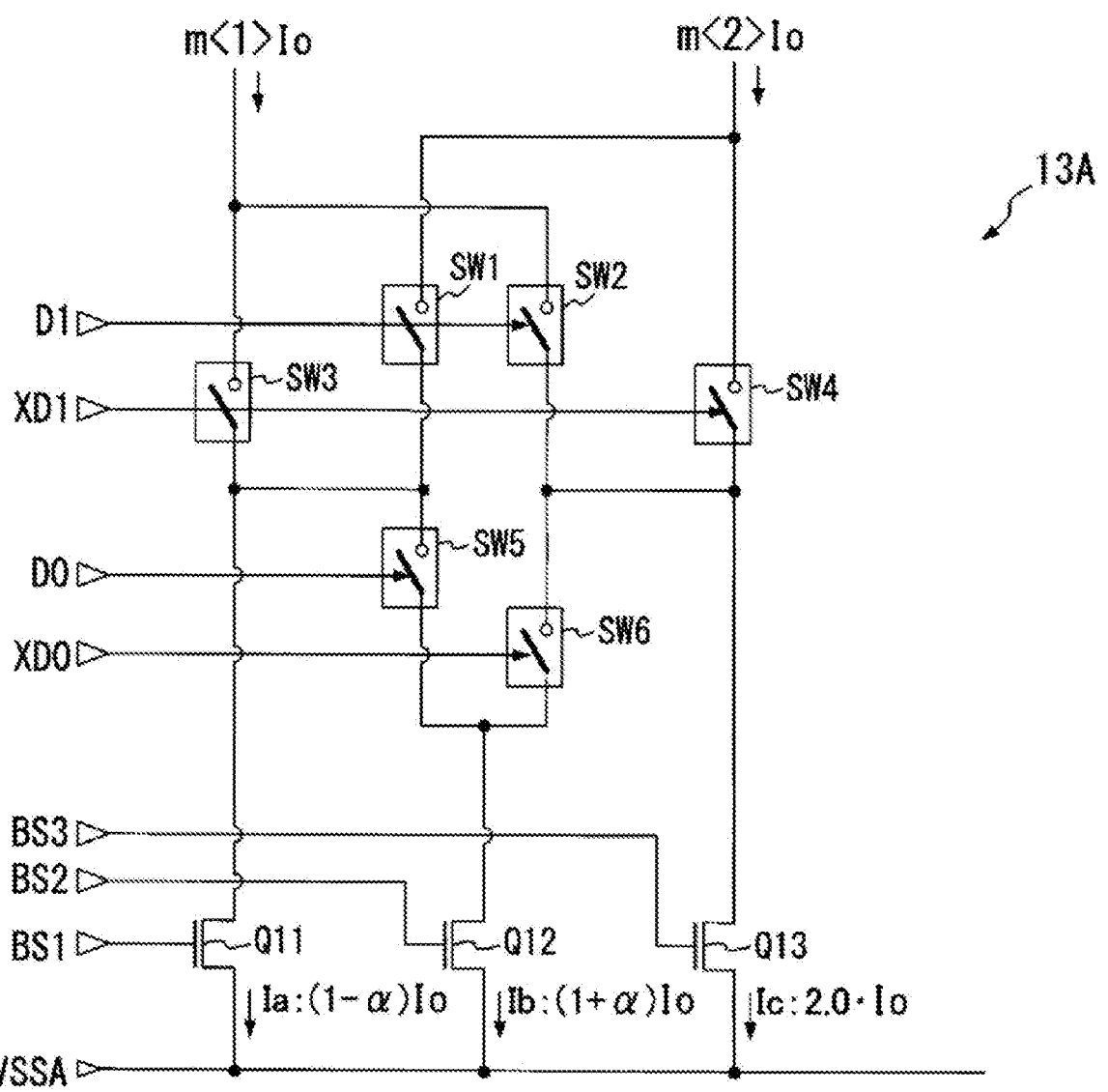
FIG. 6A is a circuit diagram showing an example of the tail current control circuit 13A.

FIG. 6A is a circuit diagram employed when realizing the tail current control circuit 13A with specifications obtained by applying the correction of the tail current ratio shown in FIG. 4B to the basic specifications shown in FIG. 4A.

In the configuration shown in FIG. 6A, the tail current control circuit 13A includes current source transistors Q11 to Q13 and transistor switches SW1 to SW6.

The current source transistor Q11 receives the bias voltage signal BS1 at the gate, thereby generating a constant current Ia corresponding to the tail current ratio "1−α" obtained by subtracting the correction value α from the tail current ratio "1" in the basic specifications shown in FIG. 4A. The current source transistor Q12 receives the bias voltage signal BS2 at the gate, thereby generating a constant current Ib corresponding to the tail current ratio "1+α" obtained by adding the correction value α to the tail current ratio "1" in the basic specifications shown in FIG. 4A. The current source transistor Q13 receives the bias voltage signal BS3 at the gate, thereby generating a constant current Ic corresponding to the tail current ratio "2" in the basic specifications shown in FIG. 4A.

The transistor switches SW1 and SW2 are controlled on/off according to the bit D1 of the digital data signal DT, and the transistor switches SW3 and SW4 are controlled on/off according to the inverted bit XD1 of the bit D1. The transistor switch SW5 is controlled on/off according to the bit D0 of the digital data signal DT, and the transistor switch SW6 is controlled on/off according to the inverted bit XD0 of the bit D0.

That is, in the configuration shown in FIG. 6A, the tail currents m<1>Io and m<2>Io are generated by selecting the path of the current flowing through each of the current source transistors Q11 to Q13 using the transistor switches SW1 to SW6 based on the digital data signal DT. Then, as shown in FIG. 4B, the tail current ratios m<1> and m<2> are controlled to change into three levels, "1−α", "2", and "3+α", for each digital code of the digital data signal DT.

Figure 6B:
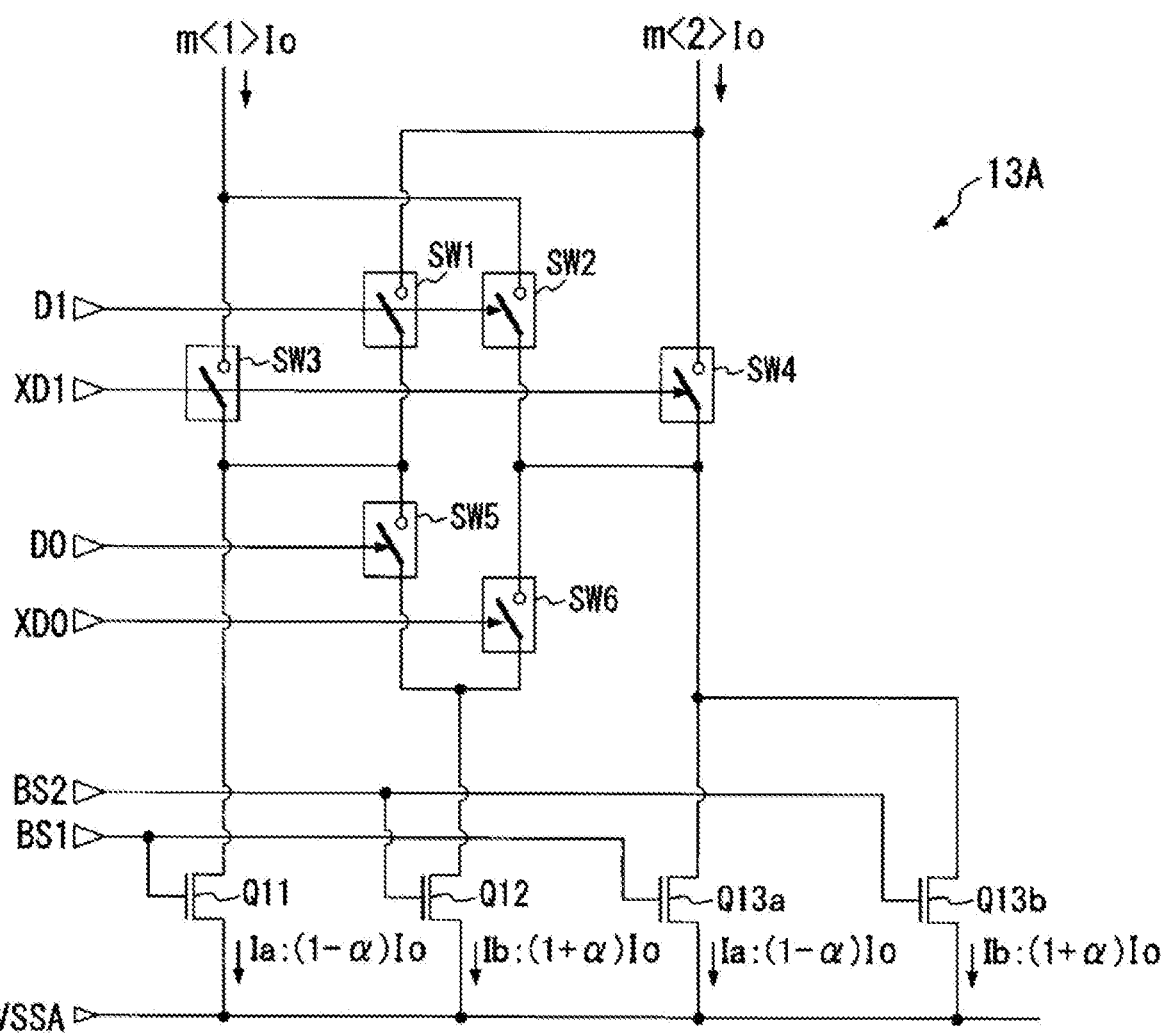
FIG. 6B is a circuit diagram showing another example of the tail current control circuit 13A.

FIG. 6B is a circuit diagram showing an example of another circuit configuration different from FIG. 6A.

The configuration shown in FIG. 6B is the same as the configuration shown in FIG. 6A, except that a current source transistor Q13a receiving the bias voltage signal BS1 at the gate and a current source transistor Q13b receiving the bias voltage signal BS2 at the gate are employed in place of the current source transistor Q13 shown in FIG. 6A. FIG. 6B has a configuration in which the number of current source transistors is increased compared to FIG. 6A, but the types of bias voltage signals are reduced.

Third Embodiment

Figure 7:
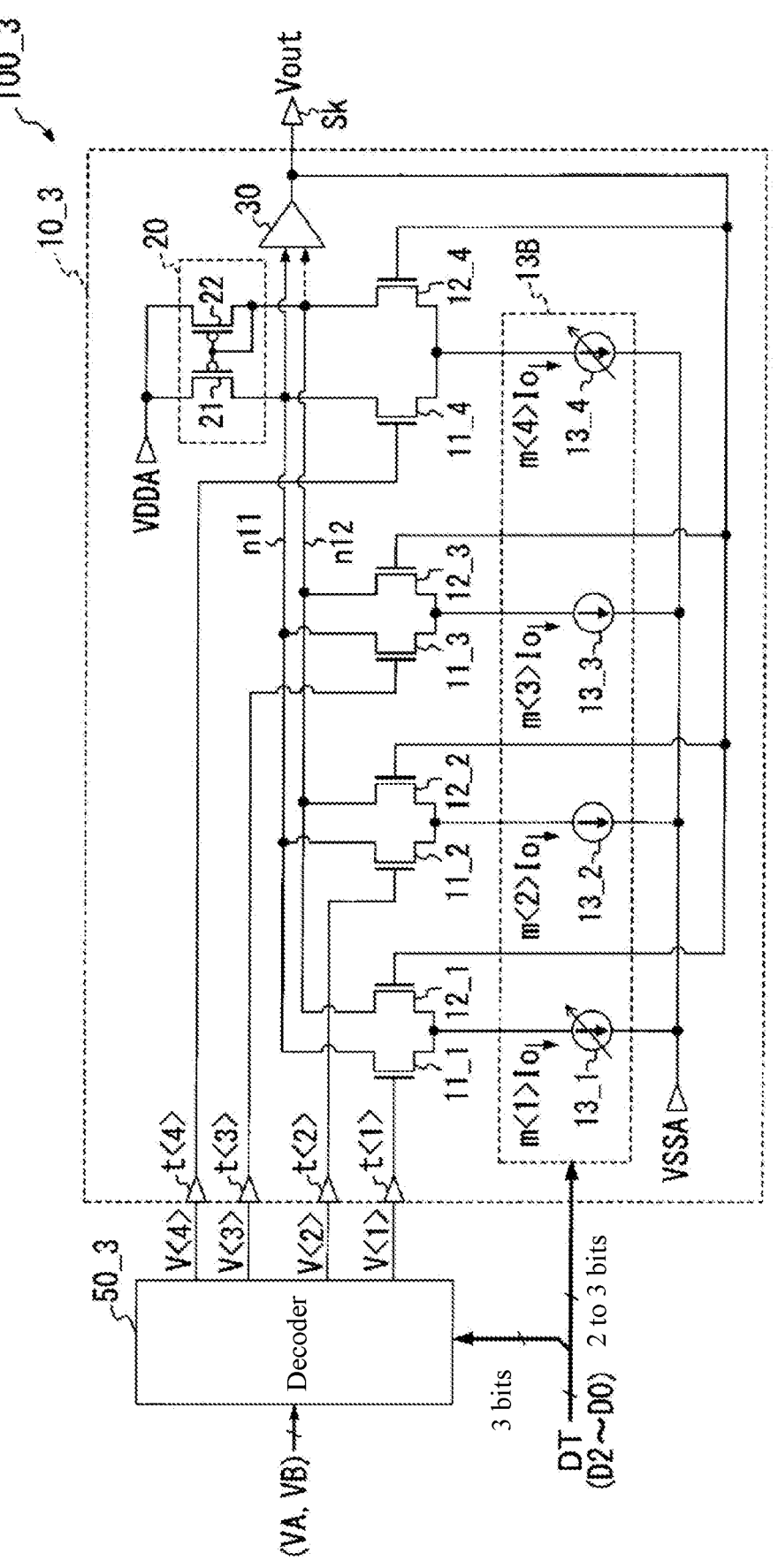
FIG. 7 is a circuit diagram showing the configuration of the digital-to-analog converter 100_3 as the third embodiment of the disclosure.

FIG. 7 is a circuit diagram showing the configuration of a digital-to-analog converter 100_3 according to the third embodiment of the disclosure.

The digital-to-analog converter 100_3 receives a 3-bit digital data signal DT, converts the digital data signal DT into an output voltage signal Vout, and outputs. The digital-to-analog converter 100_3 includes a decoder 50_3 and a differential amplifier 10_3.

The decoder 50_3 receives two voltages VA and VB having different voltage values together with the 3-bit (D0 to D2) digital data signal DT. The decoder 50_3 selects a combination of assigning the two voltages VA and VB respectively to input terminals t<1> to t<4> of the differential amplifier 103 based on the digital data signal DT. The decoder 50_3 supplies input voltages V<1> to V<4> each indicating one of the voltages VA and VB according to this selected combination to the input terminals t<1> to t<4>, which are the non-inverting input terminals of the differential amplifier 10_3.

The differential amplifier 10_3 amplifies one voltage level corresponding to the 3-bit digital data signal DT, among eight voltage levels obtained by dividing the voltages VA to VB through linear approximation, and outputs the amplification result as the output voltage signal Vout. The differential amplifier 10_3 includes four differential pairs (11_1, 12_1) to (11_4, 12_4) of the same conductivity type (N-channel type in FIG. 7), each of which is supplied with a tail current and whose output pairs are commonly connected, a tail current control circuit 13B, a current mirror circuit 20, and an amplification stage 30.

The current mirror circuit 20 includes P-channel type transistors 21 and 22 whose gates are connected to each other and which have the same size. The high potential power supply voltage VDDA is applied to the source of each of the transistors 21 and 22. Further, the drain of the transistor 21 is connected to the node n11, and the gate and drain of the transistor 22 are connected to the node n12. The nodes n11 and n12 are respectively connected to the output pairs of the differential pairs (11_1, 12_1) to (11_4, 12_4). With such a configuration, the current mirror circuit 20 operates as a common load for the differential pairs (11_1, 12_1) to (11_4, 12_4).

The output voltage signal Vout is fed back to the inverting input terminal of each of the differential pairs (11_1, 12_1) to (11_4, 12_4), that is, the gate of each of the N-channel type transistors (also referred to as differential pair transistors) 12_1 to 12_4. The non-inverting input terminals of the differential pairs (11_1, 12_1) to (11_4, 12_4), that is, the gates of the N-channel type transistors (also referred to as differential pair transistors) 11_1 to 11_4 are connected to the input terminals t<1> to t<4>. That is, the input voltages V<1> to V<4> each having the voltage VA or VB are supplied to the gates of the differential pair transistors 11_1 to 11_4.

The transistors 11_1 to 11_4 have the same transistor characteristics, and the respective drains are commonly connected through the node n11. The transistors 12_1 to 12_4 have the same transistor characteristics, and the respective drains are commonly connected through the node n12. That is, the differential pairs (11_1, 12_1) to (11_4, 12_4) have a parallel connection configuration in which the output pairs are commonly connected. The sources of the transistors of the differential pairs (11_1, 12_1) to (11_4, 12_4) are connected to each other, and each is individually connected to the tail current control circuit 13B.

The tail current control circuit 13B includes current sources 13_1 to 13_4 that are individually connected between the sources of the differential pairs (11_1, 12_1) to (11_4, 12_4) and the low potential power supply voltage VSSA. The current sources 13_1 to 13_4 generate tail currents to be supplied to the sources of the differential pairs (11_1, 12_1) to (11_4, 12_4).

It should be noted that two predetermined current sources 13_1 and 13_4 among the current sources 13_1 to 13_4 are variable current sources, and the current sources 13_2 and 13_3 are fixed current sources.

In other words, the current sources 13_1 and 13_4, which are variable current sources, control the tail current ratios of the tail currents respectively flowing through the differential pairs (11_1, 12_1) to (11_4, 12_4) based on the lower two or three bits of the digital data signal DT. It should be noted that at least one of the two variable current sources 13_1 and 13_4 may be replaced with another current source according to the digital code of the digital data signal DT.

The amplification stage 30 outputs a signal, obtained by an amplification effect based on the voltage generated from one or both of the commonly connected output pairs (nodes n11, n12) of the four differential pairs, as the output voltage signal Vout via the output terminal Sk.

The digital-to-analog converter 100_3 has four differential pairs included in the differential amplifier 10_1 of the digital-to-analog converter 100_1 shown in FIG. 1, that is, K=2, and the basic operation is the same as the digital-to-analog converter 100_1 described above.

A specific form of correction for the tail current ratio in the digital-to-analog converter 100_3 will be described below with reference to FIG. 8A, FIG. 8B, and FIG. 9A to FIG. 9C.

FIG. 8A is a diagram showing the basic specifications of the digital-to-analog converter 100_3.

The basic specifications shown in FIG. 8A represent a relationship between a combination of two voltages (VA, VB) that the decoder 50_3 assigns to the input voltages V<1> to V<4> supplied to the 4-system non-inverting input terminals of the differential amplifier 10_3 based on the 3-bit (D0 to D2) digital data signal DT, the tail current ratios m<1> to m<4>, and the output voltage signal Vout. It should be noted that an example of specifications is shown in which each digital code of 3 bits (D0 to D2) is assigned to eight voltage levels excluding the voltage VA among the voltage levels obtained by dividing the voltage VA and the voltage VB into eight.

The tail current ratios m<1> and m<4> in FIG. 8A correspond to the tail current ratios m<1> and m<$2^K$> to be variably controlled in FIG. 2A. Besides, the tail current ratios m<2> and m<3> in FIG. 8A correspond to the tail current ratios m<2> to m<$2^K-1$> shown in FIG. 2A.

In the specifications of FIG. 8A, the two differential pairs that variably control the tail current ratio are the differential pair that receives the input voltage V<1> to which the voltage VB is continuously supplied with each digital code, and the differential pair that receives the input voltage V<4> to which the voltage VA is continuously supplied with each digital code without the case that all digital codes of 3 bits (D0 to D2) are at logic level 1, and the corresponding tail current ratios m<1> and m<4> are variably controlled into three levels.

Further, in the basic specifications shown in FIG. 8A, the two voltages (VA, VB) are set to voltage levels (4.0368 volts and 4.00 volts).

Here, the expected value of the output voltage signal Vout output from the differential amplifier 10_3 is expressed by the following linear approximation formula.

$$Vout=(m<1>V<1>+m<2>V<2>+m<3>V<3>+m<4>V<4>/(m<1>+m<2>+m<3>+m<4>$$

Therefore, the expected value of the output voltage signal Vout for each digital code of the digital data signal DT when the voltage levels 4.00 to 4.0368 are divided into eight through linear interpolation is as follows, as shown in FIG. 8A:

4.0000 volts,
4.0046 volts,
4.0092 volts,
4.0138 volts,
4.0184 volts, 4.0230 volts, 4.0276 volts, 4.0322 volts, 4.0368 volts.

Figure 9A:
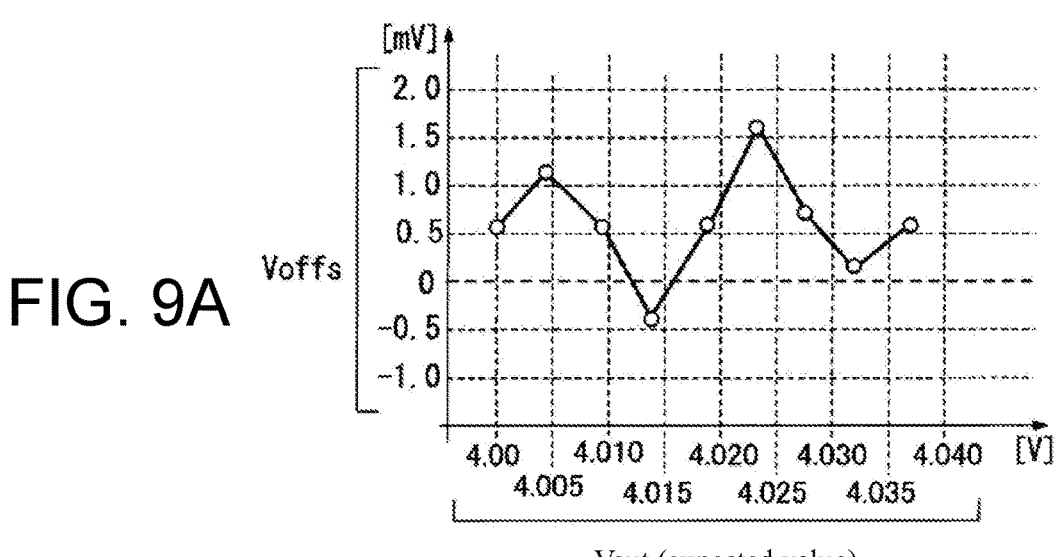
FIG. 9A is a diagram showing an example of the output error characteristics in the basic specifications of the digital-to-analog converter 100_3.

The voltage level (SIM value) of the output voltage signal Vout for each digital code of the digital data signal DT obtained by actually operating the differential amplifier 10_3 using the input voltages V<1> to V<4> and the tail current ratios m<1> to m<4> shown in FIG. 8A is as follows:

4.000585 volts, 4.005775 volts, 4.009740 volts, 4.013374 volts, 4.018967 volts, 4.024623 volts, 4.028290 volts, 4.032219 volts, 4.037385 volts. Moreover, the output error Voffs obtained by subtracting the expected value of the output voltage signal Vout from the voltage level (SIM value) of the output voltage signal Vout for each expected value of the output voltage signal Vout in FIG. 8A is shown in FIG. 9A. It should be noted that in FIG. 9A, the inherent output error of the differential amplifier uniformly includes an output error of about plus 0.5 millivolts with respect to each expected value.

That is, as shown in FIG. 8A and FIG. 9A, the output voltage signal Vout has an output error Voffs of about plus or minus 1 millivolt, larger or smaller than each expected value.

Figure 9B:
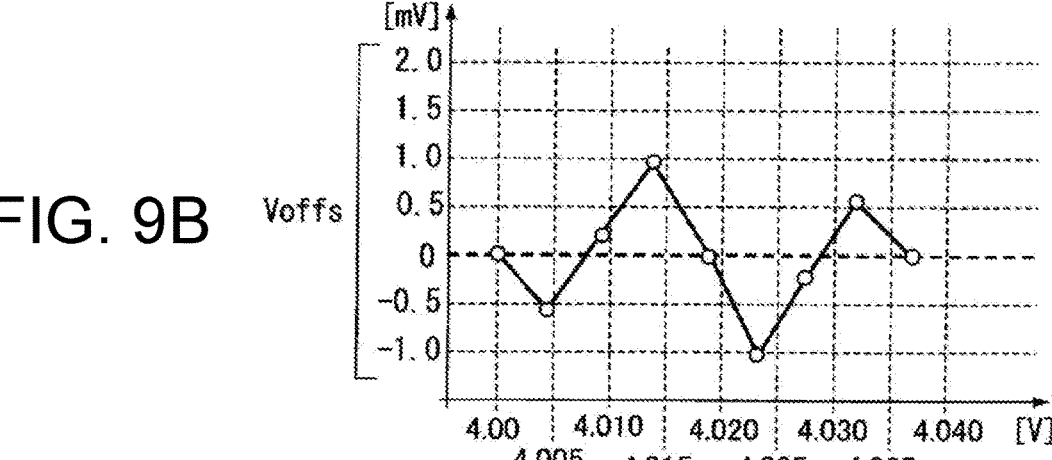
FIG. 9B is a diagram showing an example of the error correction characteristics with respect to the basic specifications in the digital-to-analog converter 100_3.

Therefore, when an output error occurs in which the voltage level of the output voltage signal Vout becomes smaller (larger) than the expected value for each expected value, correction is applied to the tail current ratios m<1> and m<4> shown in FIG. 8A to forcibly generate an output error as shown in FIG. 9B, which makes the voltage level larger (smaller) than the expected value.

Specifically, as shown in FIG. 8B, "0.15" is subtracted as the correction value α from the tail current ratio "1" of m<1> and m<4> shown in the basic specifications of FIG. 8A, and "0.15" is added as the correction value α to the tail current ratio "3". Besides, "0.08" is subtracted as the correction value β from the tail current ratio "2" of m<2> and m<3> having fixed values. Further, FIG. 9B shows the output error Voffs with respect to the calculation result of the approximate formula of the output voltage signal Vout using the corrected tail current ratio. It can be seen from FIG. 9B that the correction of the tail current ratio described above causes an output error in the opposite direction to the output error in the voltage level (SIM value) of the output voltage signal Vout shown in FIG. 9A.

As a result, the voltage level (SIM value) of the output voltage signal Vout for each digital code of the digital data signal DT obtained when actually operating the differential amplifier 10_3 using the input voltages V<1> to V<4> and the corrected tail current ratios m<1> to m<4> shown in FIG. 8B is as follows:

4.000593 volts, 4.005224 volts, 4.009960 volts, 4.014235 volts, 4.018956 volts, 4.023784 volts, 4.028123 volts, 4.032790 volts. Moreover, the output error Voffs obtained by subtracting the expected value of the output voltage signal Vout from the voltage level (SIM value) of the output voltage signal Vout for each expected value of the output voltage signal Vout in FIG. 8B is shown in FIG. 9C.

Figure 9C:
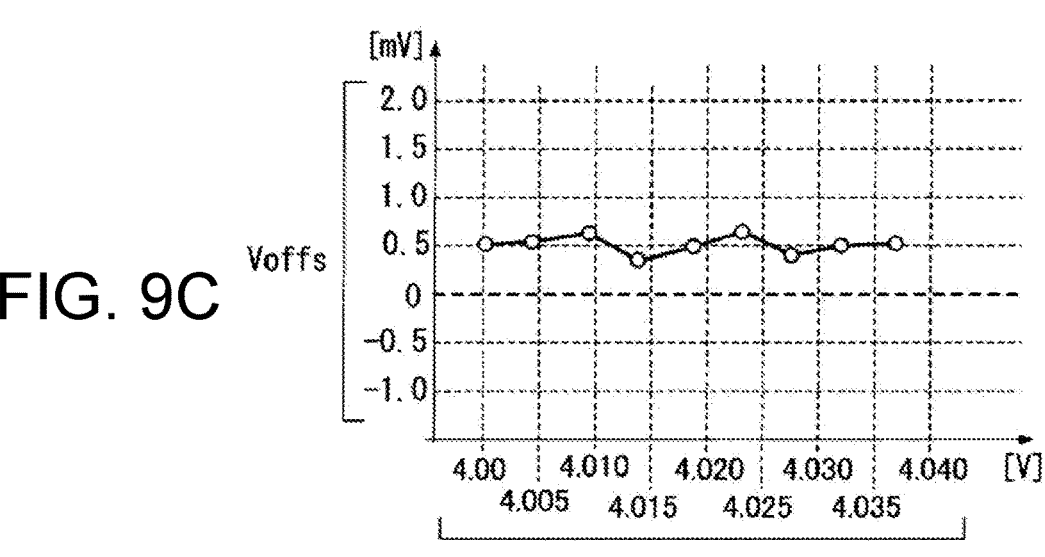
FIG. 9C is a diagram showing an example of the output error characteristics after error correction with respect to the basic specifications in the digital-to-analog converter 100_3.

That is, as shown in FIG. 8B and FIG. 9C, the output error Voffs for each expected value in the output voltage signal Vout becomes sufficiently smaller than the output error in FIG. 8A and FIG. 9A before the tail current ratio is corrected, and is reduced to about plus or minus 0.2 millivolts.

Figure 10:
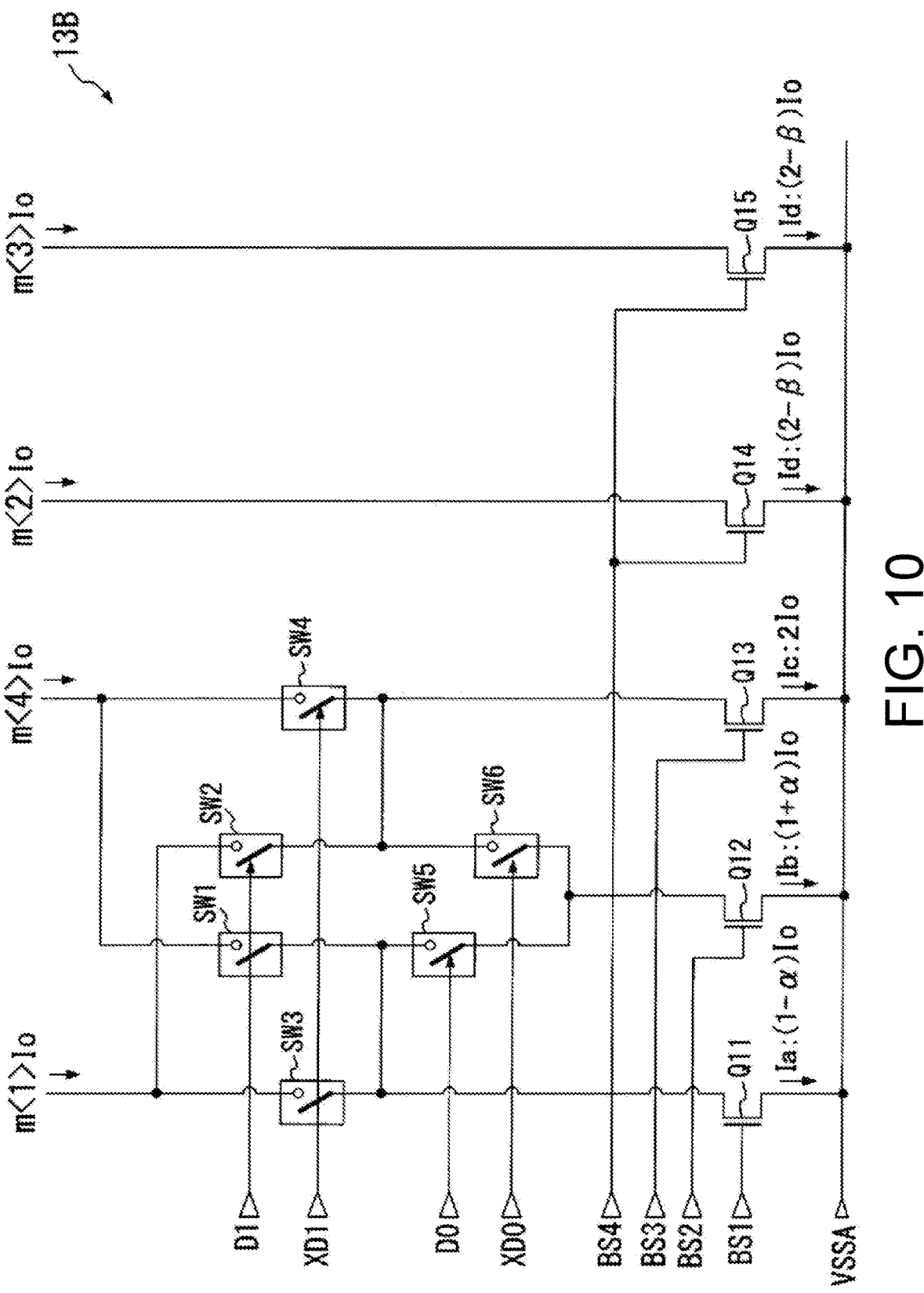
FIG. 10 is a circuit diagram showing an example of the tail current control circuit 13B.

FIG. 10 is a circuit diagram employed when realizing the tail current control circuit 13B with specifications obtained by applying the correction of the tail current ratio shown in FIG. 8B to the basic specifications shown in FIG. 8A.

In the configuration shown in FIG. 10, the tail current control circuit 13B includes current source transistors Q11 to Q15 and transistor switches SW1 to SW6.

The current source transistor Q11 receives the bias voltage signal BS1 at the gate, thereby generating a constant current Ia corresponding to the tail current ratio "1−α" obtained by subtracting the correction value α from the tail current ratio "1" in the basic specifications shown in FIG. 8A. The current source transistor Q12 receives the bias voltage signal BS2 at the gate, thereby generating a constant current Ib corresponding to the tail current ratio "1+α" obtained by adding the correction value α to the tail current ratio "1" in the basic specifications shown in FIG. 8A. The current source transistor Q13 receives the bias voltage signal BS3 at the gate, thereby generating a constant current Ic corresponding to the tail current ratio "2" in the basic specifications shown in FIG. 8A.

The current source transistors Q14 and Q15 receive the bias voltage signal BS4 at the gates, thereby respectively generating a constant current Id corresponding to the tail current ratio "2−β" obtained by subtracting the correction value β from the tail current ratio "2" in the basic specifications shown in FIG. 8A.

The transistor switches SW1 and SW2 are controlled on/off according to the bit D1 of the digital data signal DT, and the transistor switches SW3 and SW4 are controlled on/off according to the inverted bit XD1 of the bit D1. The transistor switch SW5 is controlled on/off according to the bit D0 of the digital data signal DT, and the transistor switch SW6 is controlled on/off according to the inverted bit XD0 of the bit D0.

That is, in the configuration shown in FIG. 10, the tail currents m<1>Io and m<4>Io are generated by selecting the path of the current flowing through each of the current source transistors Q11 to Q13 using the transistor switches SW1 to SW6 based on the digital data signal DT. Then, as shown in FIG. 8B, the tail current ratios m<1> and m<4> are controlled to change into three levels, "1−α", "2", and "3+α", for each digital code of the digital data signal DT.

Since the tail current ratios m<2> and m<3> of the tail currents m<2>Io and m<3>Io are fixed regardless of the digital data signal DT, that is, "2−β", the tail currents m<2>Io and m<3>Io are directly generated by the current source transistors Q14 and Q15.

FIG. 11A is a diagram showing a modified example of the basic specifications shown in FIG. 8A, and FIG. 11B is a diagram representing the specifications showing the corrected tail current ratio with respect to the basic specifications shown in FIG. 11A.

The basic specifications shown in FIG. 11A are specifications in which the input voltages V<2> and V<3> are made common to the basic specifications shown in FIG. 8A. When employing the basic specifications shown in FIG. 11A, one of the two differential pairs that variably controls the tail current ratio is a differential pair that receives the input voltage V<1> to which the voltage VB is continuously supplied with each digital code. However, the other of the two differential pairs to which the voltage VA is continuously supplied with each digital code does not exist.

In the basic specifications shown in FIG. 11A, the differential pair that receives the input voltage V<3> having the voltage VA when the bit D2 of the digital data signal DT indicates logic level 0, and the differential pair that receives the input voltage V<4> having the voltage VA when the bit D2 indicates logic level 1 are to be subjected to variable tail current ratio control. In other words, when the bit D2 of the digital data signal DT indicates logic level 0, the tail current ratios m<1> and m<3> are to be variably controlled, and when the bit D2 indicates logic level 1, the tail current ratios m<1> and m<4> are to be variably controlled. In addition, it is also possible to replace the tail current ratio to be controlled when the bit D2 of the digital data signal DT indicates logic level 0 from the tail current ratio m<3> to the tail current ratio m<2>. The characteristics of the output error Voffs in the basic specifications of FIG. 11A are similar to the characteristics in FIG. 9A.

In the specifications after correction of the tail current ratio shown in FIG. 11B, in order to generate an output error in the opposite direction to the output error in the voltage level (SIM value) of the output voltage signal Vout shown in FIG. 9A, the following correction is applied to the tail current ratios "1" and "3" that cause an increase in output error among the tail current ratios in FIG. 11A. In other words, for the tail current ratios "1" and "3" of the tail current ratios m<1> and m<3> (D2=0) and the tail current ratio m<1> and m<4> (D2=1) shown in FIG. 11A, "0.15" is subtracted as the correction value α from the tail current ratio "1", and "0.15" is added as the correction value α to the tail current ratio "3". Furthermore, in the specifications after correction of the tail current ratio shown in FIG. 11B, "0.08" is subtracted as the correction value β from the tail current ratio "2" of the tail current ratios m<2> and m<4> (D2=0) with fixed tail current ratios, the tail current ratio m<2> and m<3> (D2=1). The characteristics of the output error Voffs in the specifications after correction of the tail current ratio shown in FIG. 11B are similar to the characteristics in FIG. 9C.

Figure 12:
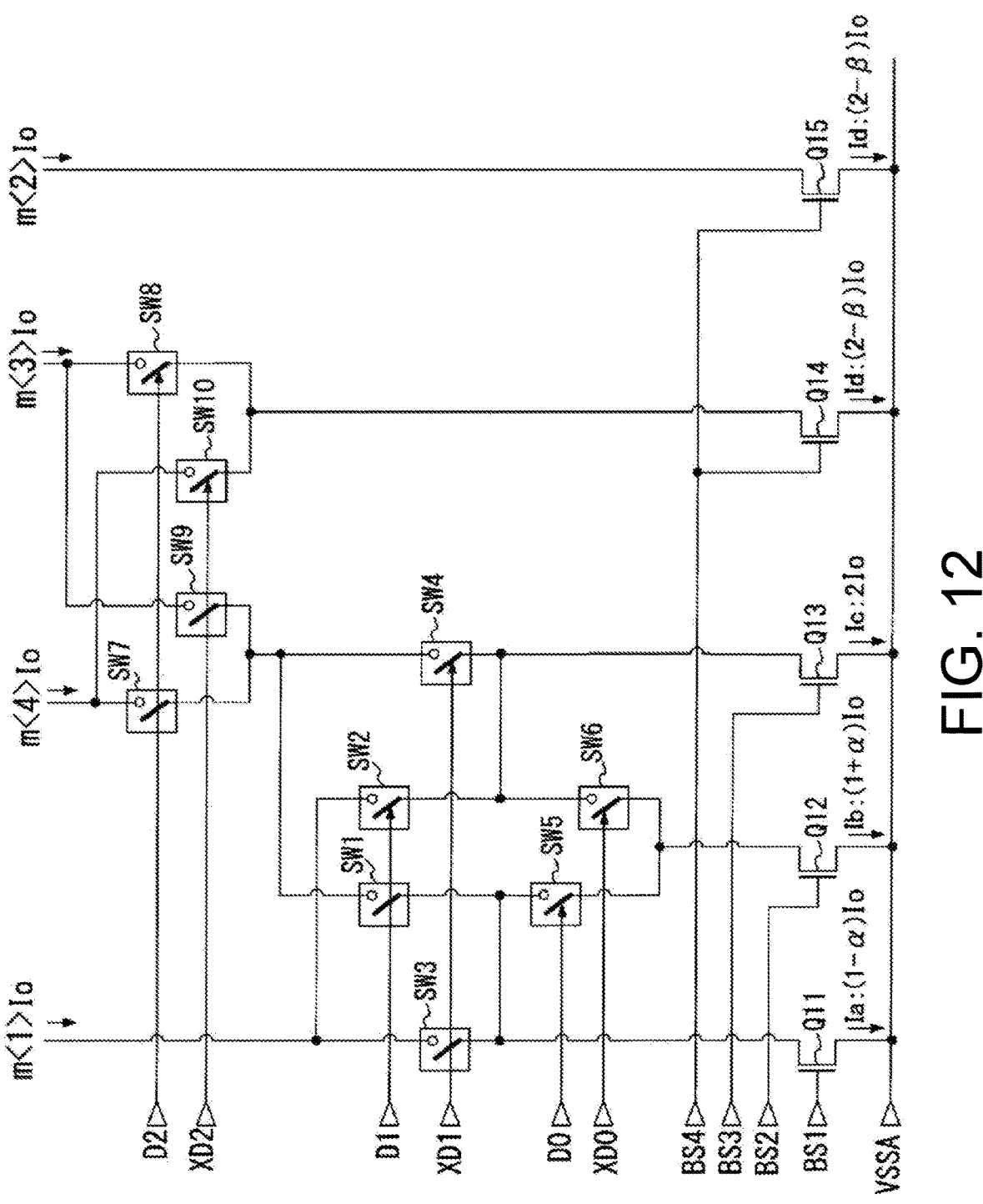
FIG. 12 is a circuit diagram showing an example of the tail current control circuit 13B.

FIG. 12 is a circuit diagram showing an example of the configuration employed when realizing the tail current control circuit 13B with specifications obtained by applying the correction of the tail current ratio shown in FIG. 11B to the basic specifications shown in FIG. 11A.

In the configuration shown in FIG. 12, the tail current control circuit 13B includes current source transistors Q11 to Q15 and transistor switches SW1 to SW10.

The current source transistor Q11 receives the bias voltage signal BS1 at the gate, thereby generating a constant current Ia corresponding to the tail current ratio "1−α" obtained by subtracting the correction value α from the tail current ratio "1" in the basic specifications shown in FIG. 11A. The current source transistor Q12 receives the bias voltage signal BS2 at the gate, thereby generating a constant current Ib corresponding to the tail current ratio "1+α" obtained by adding the correction value α to the tail current ratio "1" in the basic specifications shown in FIG. 11A. The current source transistor Q13 receives the bias voltage signal BS3 at the gate, thereby generating a constant current Ic corresponding to the tail current ratio "2" in the basic specifications shown in FIG. 11A.

Each of the current source transistors Q14 and Q15 receives the bias voltage signal BS4 at the gate, thereby respectively generating a constant current Id corresponding to the tail current ratio "2−β" obtained by subtracting the correction value β from the tail current ratio "2" in the basic specifications shown in FIG. 11A.

The transistor switches SW1 and SW2 are controlled on/off according to the bit D1 of the digital data signal DT, and the transistor switches SW3 and SW4 are controlled on/off according to the inverted bit XD1 of the bit D1. The transistor switch SW5 is controlled on/off according to the bit D0 of the digital data signal DT, and the transistor switch SW6 is controlled on/off according to the inverted bit XD0 of the bit D0.

The transistor switches SW7 and SW8 are controlled on/off according to the bit D2 of the digital data signal DT, and the transistor switches SW9 and SW10 are controlled on/off according to the inverted bit XD2 of the bit D2.

That is, in the configuration shown in FIG. 12, the tail currents m<1>Io, m<3>Io, and m<4>Io are generated by selecting the path of the current flowing through each of the current source transistors Q11 to Q14 using the transistor switches SW1 to SW10 based on the digital data signal DT. Then, as shown in FIG. 11B, the tail current ratios m<1> and m<3> (D2=0) and the tail current ratios m<1> and m<4> (D2=1) are controlled to change into three levels, "1−α", "2", and "3+α", for each digital code of the digital data signal DT. The tail current ratios m<4> (D2=0) and m<3> (D2=1) are controlled to the fixed value "2−β".

Furthermore, since the tail current ratio m<2> of the tail current m<2>Io is fixed regardless of the digital data signal DT, that is, "2−β", the tail current m<2>Io is directly generated by the current source transistor Q15.

Fourth Embodiment

Figure 13:
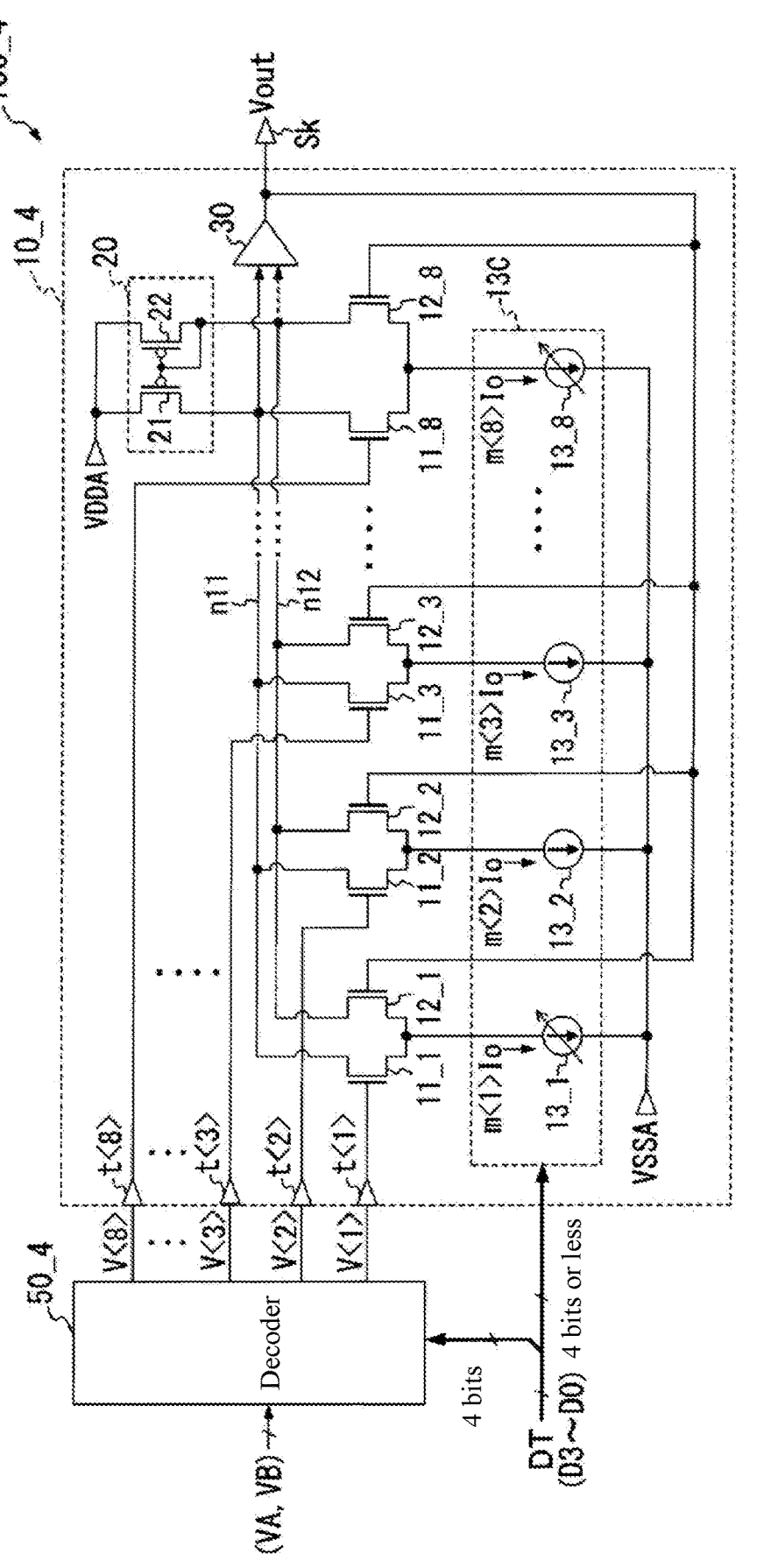
FIG. 13 is a circuit diagram showing the configuration of the digital-to-analog converter 100_4 as the fourth embodiment of the disclosure.

FIG. 13 is a circuit diagram showing the configuration of a digital-to-analog converter 100_4 according to the fourth embodiment of the disclosure.

The digital-to-analog converter 100_4 receives a 4-bit digital data signal DT, converts the digital data signal DT into an output voltage signal Vout, and outputs. The digital-to-analog converter 100_4 includes a decoder 50_4 and a differential amplifier 10_4. The decoder 50_4 receives two voltages VA and VB having different voltage values together with the 4-bit (Do to D3) digital data signal DT. The decoder 50_4 selects a combination of assigning the two voltages VA and VB respectively to input terminals t<1> to t<8> of the differential amplifier 10_4 based on the digital data signal DT. The decoder 50_4 supplies input voltages V<1> to V<8> each indicating one of the voltages VA and VB according to this selected combination to the input terminals t<1> to t<8>, which are the non-inverting input terminals of the differential amplifier 10_4.

The differential amplifier 10_4 amplifies one voltage level corresponding to the 4-bit digital data signal DT, among sixteen voltage levels obtained by dividing the voltages VA to VB through linear approximation, and outputs the amplification result as the output voltage signal Vout. The differential amplifier 104 includes eight differential pairs (11_1, 12_1) to (11_8, 12_8) of the same conductivity type (N-channel type in FIG. 13), each of which is supplied with a tail current and whose output pairs are commonly connected, a tail current control circuit 13C, a current mirror circuit 20, and an amplification stage 30.

The current mirror circuit 20 includes P-channel type transistors 21 and 22 whose gates are connected to each other and which have the same size. The high potential power supply voltage VDDA is applied to the source of each of the transistors 21 and 22. Further, the drain of the transistor 21 is connected to the node n11, and the gate and drain of the transistor 22 are connected to the node n12. The nodes n11 and n12 are respectively connected to the output pairs of the differential pairs (11_1, 12_1) to (11_8, 12_8). With such a configuration, the current mirror circuit 20 operates as a common load for the differential pairs (11_1, 12_1) to (11_8, 12_8).

The output voltage signal Vout is fed back to the inverting input terminal of each of the differential pairs (11_1, 12_1) to (11_8, 12_8), that is, the gate of each of the N-channel type transistors (also referred to as differential pair transistors) 12_1 to 12_8. The non-inverting input terminals of the differential pairs (11_1, 12_1) to (11_8, 12_8), that is, the gates of the N-channel type transistors (also referred to as differential pair transistors) 11_1 to 11_8 are connected to the input terminals t<1> to t<8>. That is, the input voltages V<1> to V<8> each having the voltage VA or VB are supplied to the gates of the differential pair transistors 11_1 to 11_8.

The transistors 11_1 to 11_8 have the same transistor characteristics, and the respective drains are commonly connected through the node n11. The transistors 12_1 to 12_8 have the same transistor characteristics, and the respective drains are commonly connected through the node n12. That is, the differential pairs (11_1, 12_1) to (11_8, 12_8) have a parallel connection configuration in which the output pairs are commonly connected. The sources of the transistors of the differential pairs (11_1, 12_1) to (11_8, 12_8) are connected to each other, and each is individually connected to the tail current control circuit 13C.

The tail current control circuit 13C includes current sources 13_1 to 13_8 that are individually connected between the sources of the differential pairs (11_1, 12_1) to (11_8, 12_8) and the low potential power supply voltage VSSA. The current sources 13_1 to 13_8 generate tail currents to be supplied to the sources of the differential pairs (11_1, 12_1) to (11_8, 12_8).

It should be noted that two predetermined current sources 13_1 and 13_8 among the current sources 13_1 to 13_8 are variable current sources, and the current sources 13_2 to 13_7 are fixed current sources.

In other words, the current sources 13_1 and 13_8, which are variable current sources, control the tail current ratios of the tail currents respectively flowing through the differential pairs (11_1, 12_1) to (11_8, 12_8) based on the lower two, three, or four bits of the digital data signal DT. It should be noted that at least one of the two variable current sources 13_1 and 13_8 may be replaced with another current source according to the digital code of the digital data signal DT.

The amplification stage 30 outputs a signal, obtained by an amplification effect based on the voltage generated from one or both of the commonly connected output pairs (nodes n11, n12) of the eight differential pairs, as the output voltage signal Vout via the output terminal Sk.

The digital-to-analog converter 100_4 has eight differential pairs included in the differential amplifier 10_1 of the digital-to-analog converter 100_1 shown in FIG. 1, that is, K=3, and the basic operation is the same as the digital-to-analog converter 100_1 described above.

A specific form of correction for the tail current ratio in the digital-to-analog converter 100_4 will be described below with reference to FIG. 14A to FIG. 14D and FIG. 15A to FIG. 15C.

FIG. 14A and FIG. 14B are diagrams showing the basic specifications of the digital-to-analog converter 100_4.

The basic specifications shown in FIG. 14A and FIG. 14B represent a relationship between a combination of two voltages (VA, VB) that the decoder 50_4 assigns to the input voltages V<1> to V<8> supplied to the 8-system non-inverting input terminals of the differential amplifier 10_4 based on the 4-bit (D0 to D3) digital data signal DT, the tail current ratios m<1> to m<8>, and the output voltage signal Vout. It should be noted that an example of specifications is shown in which each digital code of 4 bits (D0 to D3) is assigned to sixteen voltage levels excluding the voltage VA among the voltage levels obtained by dividing the voltage VA and the voltage VB into sixteen.

The tail current ratios m<1> and m<8> in FIG. 14A and FIG. 14B correspond to the tail current ratios m<1> and m<$2^K$> to be variably controlled in FIG. 2A. Besides, the tail current ratios m<2> to m<7> in FIG. 14A and FIG. 14B correspond to the tail current ratios m<2> to m<$2^K-1$> shown in FIG. 2A.

In the basic specifications of FIG. 14A and FIG. 14B, the two differential pairs that variably control the tail current ratio are the differential pair that receives the input voltage V<1> to which the voltage VB is continuously supplied with each digital code, and the differential pair that receives the input voltage V<8> to which the voltage VA is continuously supplied with each digital code without the case that all digital codes of 4 bits (D0 to D3) are at logic level 1, and the corresponding tail current ratios m<1> and m<8> are variably controlled into three levels.

Further, in the basic specifications shown in FIG. 14A and FIG. 14B, the two voltages (VA, VB) are set to voltage levels (4.0736 volts and 4 volts).

Here, the expected value of the output voltage signal Vout output from the differential amplifier 10_4 is expressed by the following linear approximation formula.

$$Vout=(m<1>V<1>+m<2>V<2>+m<3>V<3>+\ldots+m<8>V<8>)/(m<1>+m<2>+m<3>+\ldots+m<8>)$$

Figure 15A:
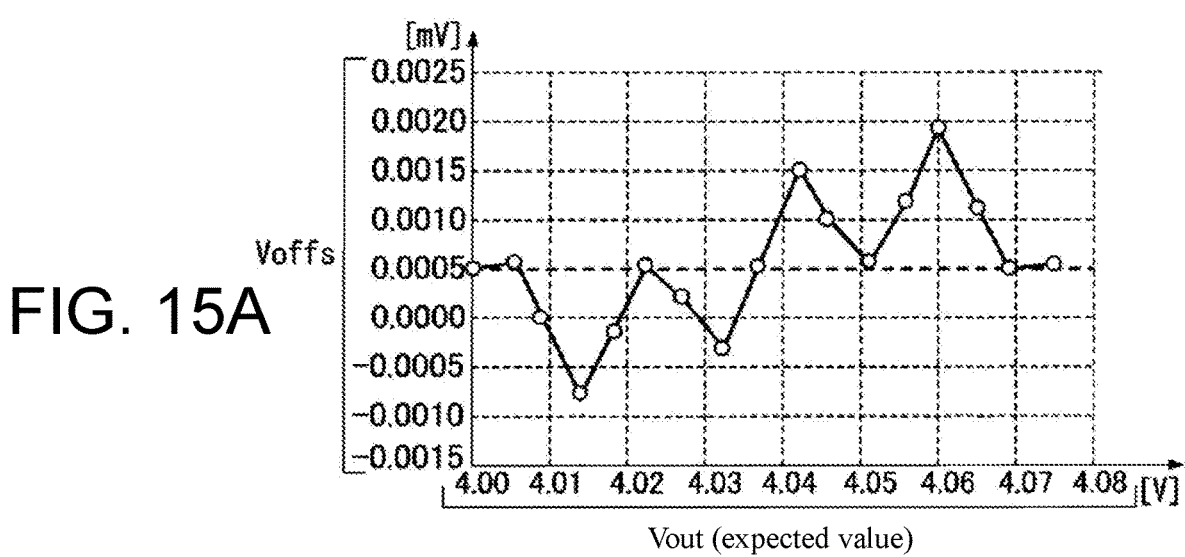
FIG. 15A is a diagram showing an example of the output error characteristics in the basic specifications of the digital-to-analog converter 100_4.

Here, the expected value of the output voltage signal Vout when the voltage levels 4.00 to 4.0736 are divided into sixteen through linear interpolation, and the voltage level (SIM value) of the output voltage signal Vout obtained by actually operating the differential amplifier 10_4 using the input voltages V<1> to V<8> and the tail current ratios m<1> to m<8> are as shown in FIG. 14A and FIG. 14B. Moreover, the output error Voffs obtained by subtracting the expected value of the output voltage signal Vout from the voltage level (SIM value) of the output voltage signal Vout for each expected value of the output voltage signal Vout in FIG. 14A and FIG. 14B is shown in FIG. 15A. It should be noted that in FIG. 15A, the inherent output error of the differential amplifier uniformly includes an output error of about plus 0.5 millivolts with respect to each expected value.

That is, as shown in FIG. 14A, FIG. 14B, and FIG. 15A, the output voltage signal Vout has an output error Voffs of about plus or minus 1.5 millivolts, larger or smaller than each expected value.

Figure 15B:
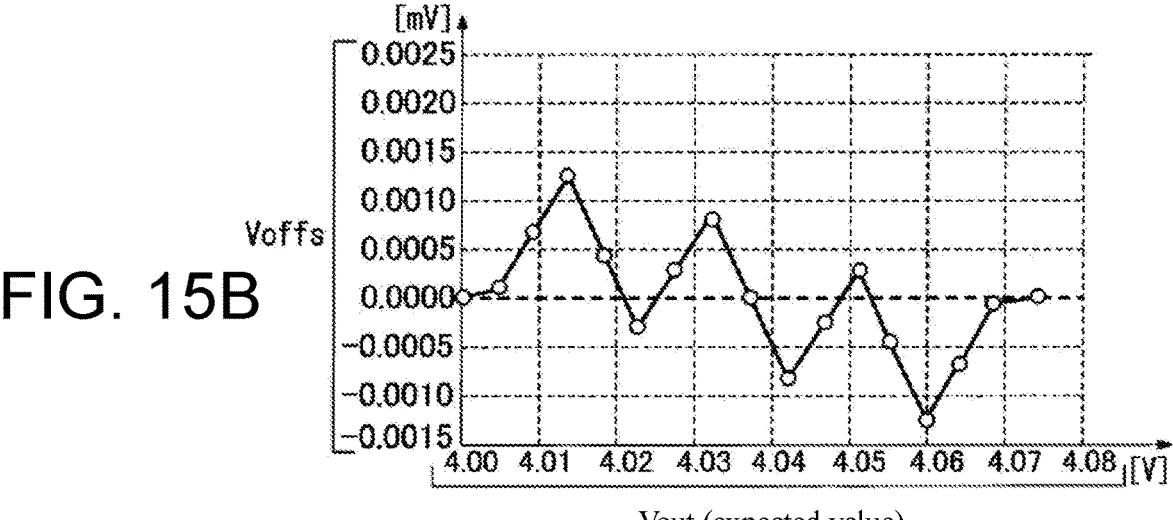
FIG. 15B is a diagram showing an example of the error correction characteristics with respect to the basic specifications in the digital-to-analog converter 100_4.

Therefore, when an output error occurs in which the voltage level of the output voltage signal Vout becomes smaller (larger) than the expected value for each expected value, correction is applied to the tail current ratios m<1> and m<8> shown in FIG. 14A and FIG. 14B to forcibly generate an output error as shown in FIG. 15B, which makes the voltage level larger (smaller) than the expected value.

Specifically, in the corrected specifications shown in FIG. 14C and FIG. 14D, "0.05" is subtracted as the correction value α from the tail current ratio "1" of m<1> and m<8> shown in the basic specifications of FIG. 14A and FIG. 14B, and "0.05" is added as the correction value α to the tail current ratio "3". Besides, "0.18" is subtracted as the correction value β from the tail current ratio "2" of m<2> to m<7> having fixed values. Further, FIG. 15B shows the output error Voffs with respect to the calculation result of the approximate formula of the output voltage signal Vout using the corrected tail current ratio. It can be seen from FIG. 15B that the correction of the tail current ratio described above causes an output error in the opposite direction to the output error in the voltage level (SIM value) of the output voltage signal Vout shown in FIG. 15A.

Figure 15C:
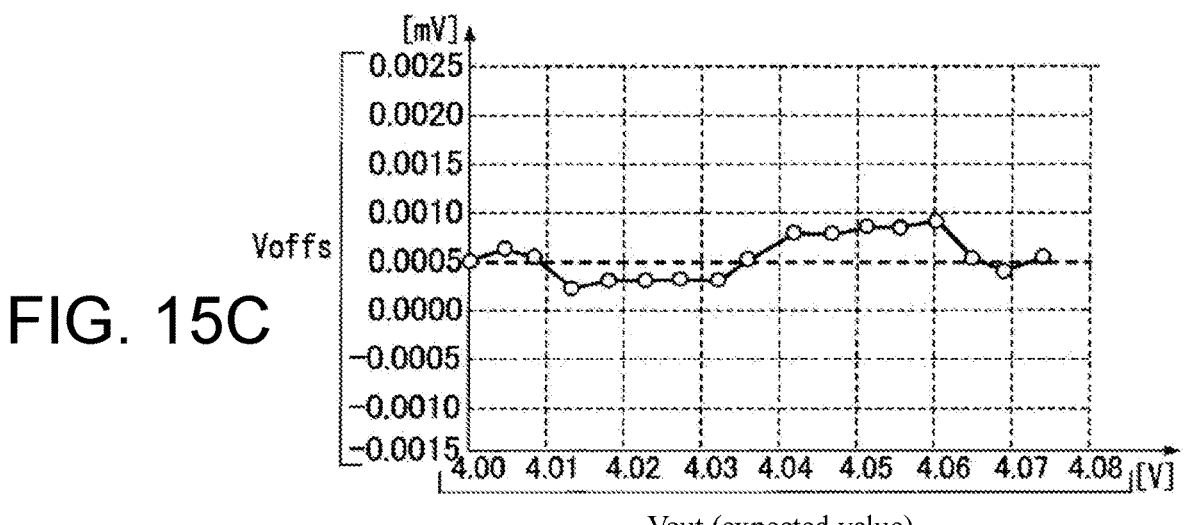
FIG. 15C is a diagram showing an example of the output error characteristics after error correction with respect to the basic specifications in the digital-to-analog converter 100_4.

As a result, the output error Voffs that occurs in the voltage level (SIM value) of the output voltage signal Vout for each digital code of the digital data signal DT obtained when actually operating the differential amplifier 10_4 using the input voltages V<1> to V<8> and the corrected tail current ratios m<1> to m<8> shown in FIG. 14C and FIG. 14D is reduced to about plus or minus 0.45 millivolts, as shown in FIG. 15C.

Figure 16:
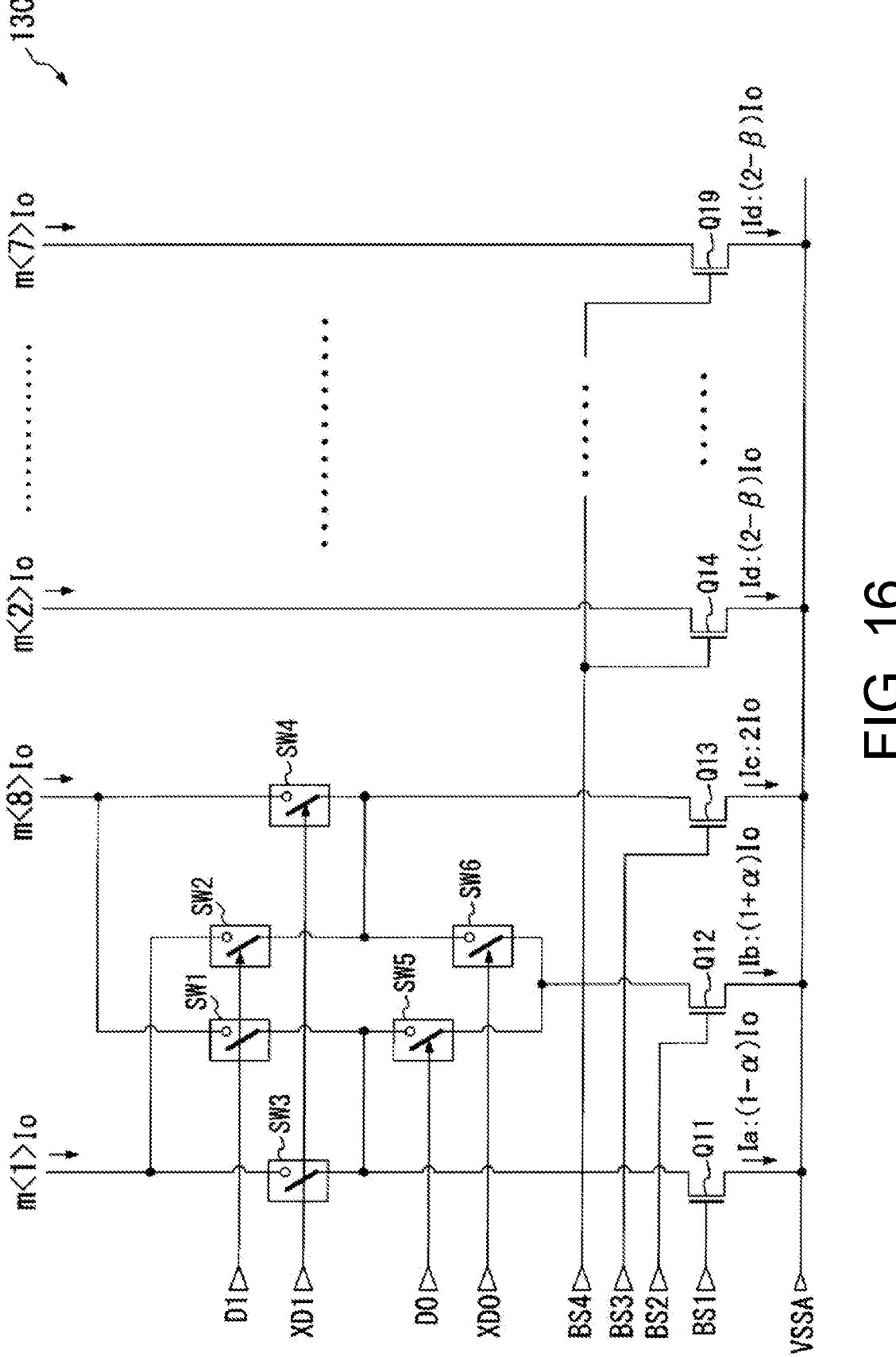
FIG. 16 is a circuit diagram showing an example of the tail current control circuit 13C.

FIG. 16 is a circuit diagram employed when realizing the tail current control circuit 13C with specifications obtained by applying the correction of the tail current ratio shown in FIG. 14C and FIG. 14D to the basic specifications shown in FIG. 14A and FIG. 14B.

In the configuration shown in FIG. 16, the tail current control circuit 13C includes current source transistors Q11 to Q19 and transistor switches SW1 to SW6.

The current source transistor Q11 receives the bias voltage signal BS1 at the gate, thereby generating a constant current Ia corresponding to the tail current ratio "1−α" obtained by subtracting the correction value α from the tail current ratio "1" in the basic specifications shown in FIG. 14A and FIG. 14B. The current source transistor Q12 receives the bias voltage signal BS2 at the gate, thereby generating a constant current Ib corresponding to the tail current ratio "1+α" obtained by adding the correction value α to the tail current ratio "1" in the basic specifications shown in FIG. 14A and FIG. 14B. The current source transistor Q13 receives the bias voltage signal BS3 at the gate, thereby generating a constant current Ic corresponding to the tail current ratio "2" in the basic specifications shown in FIG. 14A and FIG. 14B.

Each of the current source transistors Q14 to Q19 receives the bias voltage signal BS4 at the gate, thereby respectively generating a constant current Id corresponding to the tail current ratio "2−β" obtained by subtracting the correction value β from the tail current ratio "2" in the basic specifications shown in FIG. 14A and FIG. 14B.

The transistor switches SW1 and SW2 are controlled on/off according to the bit D1 of the digital data signal DT, and the transistor switches SW3 and SW4 are controlled on/off according to the inverted bit XD1 of the bit D1. The transistor switch SW5 is controlled on/off according to the bit D0 of the digital data signal DT, and the transistor switch SW6 is controlled on/off according to the inverted bit XD0 of the bit D0.

That is, in the configuration shown in FIG. 16, the tail currents m<1>Io and m<8>Io are generated by selecting the path of the current flowing through each of the current source transistors Q11 to Q13 using the transistor switches SW1 to SW6 based on the digital data signal DT. Then, as shown in FIG. 14C and FIG. 14D, the tail current ratios m<1> and m<8> are controlled to change into three levels, "1−α", "2", and "3+α", for each digital code of the digital data signal DT.

Since the tail current ratios m<2> to m<7> of the tail currents m<2>Io to m<7>Io are fixed regardless of the digital data signal DT, that is, "2−β", the tail currents m<2>Io to m<7>Io are directly generated by the current source transistors Q14 to Q19.

FIG. 17A and FIG. 17B are diagram showing a modified example of the basic specifications shown in FIG. 14A and FIG. 14B, and FIG. 17C and FIG. 17D are diagrams representing the specifications showing the corrected tail current ratio with respect to the basic specifications shown in FIG. 17A and FIG. 17B.

The basic specifications shown in FIG. 17A and FIG. 17B are specifications in which the input voltages V<3> and V<4> are made common, the input voltages V<5> and V<6> are made common, and the input voltages V<7> and V<8> are made common to the basic specifications shown in FIG. 14A and FIG. 14B.

When employing the basic specifications shown in FIG. 17A and FIG. 17B, one of the two differential pairs that variably controls the tail current ratio is a differential pair that receives the input voltage V<1> to which the voltage VB is continuously supplied with each digital code, similar to the basic specifications shown in FIG. 14A and FIG. 14B. However, the other of the two differential pairs to which the voltage VA is continuously supplied with each digital code does not exist.

In the basic specifications shown in FIG. 17A and FIG. 17B, the differential pair that receives the input voltage V<8> having the voltage VA when the bit (D3, D2) of the digital data signal DT indicates (0, 0), (0, 1), and (1, 0), and the differential pair that receives the input voltage V<2> having the voltage VA when the bit (D3, D2) indicates (1, 1) are to be subjected to variable tail current ratio control. In other words, as shown in FIG. 17A and FIG. 17B, when the bit (D3, D2) of the digital data signal DT indicates logic level other than (1, 1), the tail current ratios m<1> and m<8> are to be variably controlled, and when the bit (D3, D2) indicates (1, 1), the tail current ratios m<1> and m<2> are to be variably controlled. In addition, it is also possible to use the tail current ratio m<7> as a variable control target instead of the tail current ratio m<8>. The characteristics of the output error Voffs in the basic specifications of FIG. 17A and FIG. 17B are similar to the characteristics in FIG. 15A.

In the specifications after correction of the tail current ratio shown in FIG. 17C and FIG. 17D, in order to generate an output error in the opposite direction to the output error in the voltage level (SIM value) of the output voltage signal Vout shown in FIG. 15A, the following correction is applied to the tail current ratios "1" and "3" that cause an increase in output error Voffs among the tail current ratios.

In other words, for the tail current ratios "1" and "3" of the tail current ratios m<1> and m<8> when the bit (D3, D2) is other than logic level (1, 1), and the tail current ratio m<2> when the bit (D3, D2) indicates logic level (1, 1), as shown in FIG. 17A and FIG. 17B, "0.05" is subtracted as the correction value α from the tail current ratio "1", and "0.05" is added as the correction value α to the tail current ratio "3".

Furthermore, in the specifications after correction of the tail current ratio shown in FIG. 17C and FIG. 17D, "0.18" is subtracted as the correction value β from the tail current ratio "2" of the tail current ratio m<2> when the bit (D3, D2) is other than logic level (1, 1), the tail current ratio m<8> when the bit (D3, D2) indicates logic level (1, 1), and the tail current ratios m<3> to m<7>. The characteristics of the output error Voffs in the specifications after correction of the tail current ratio shown in FIG. 17C and FIG. 17D are similar to the characteristics in FIG. 15C.

Figure 18:
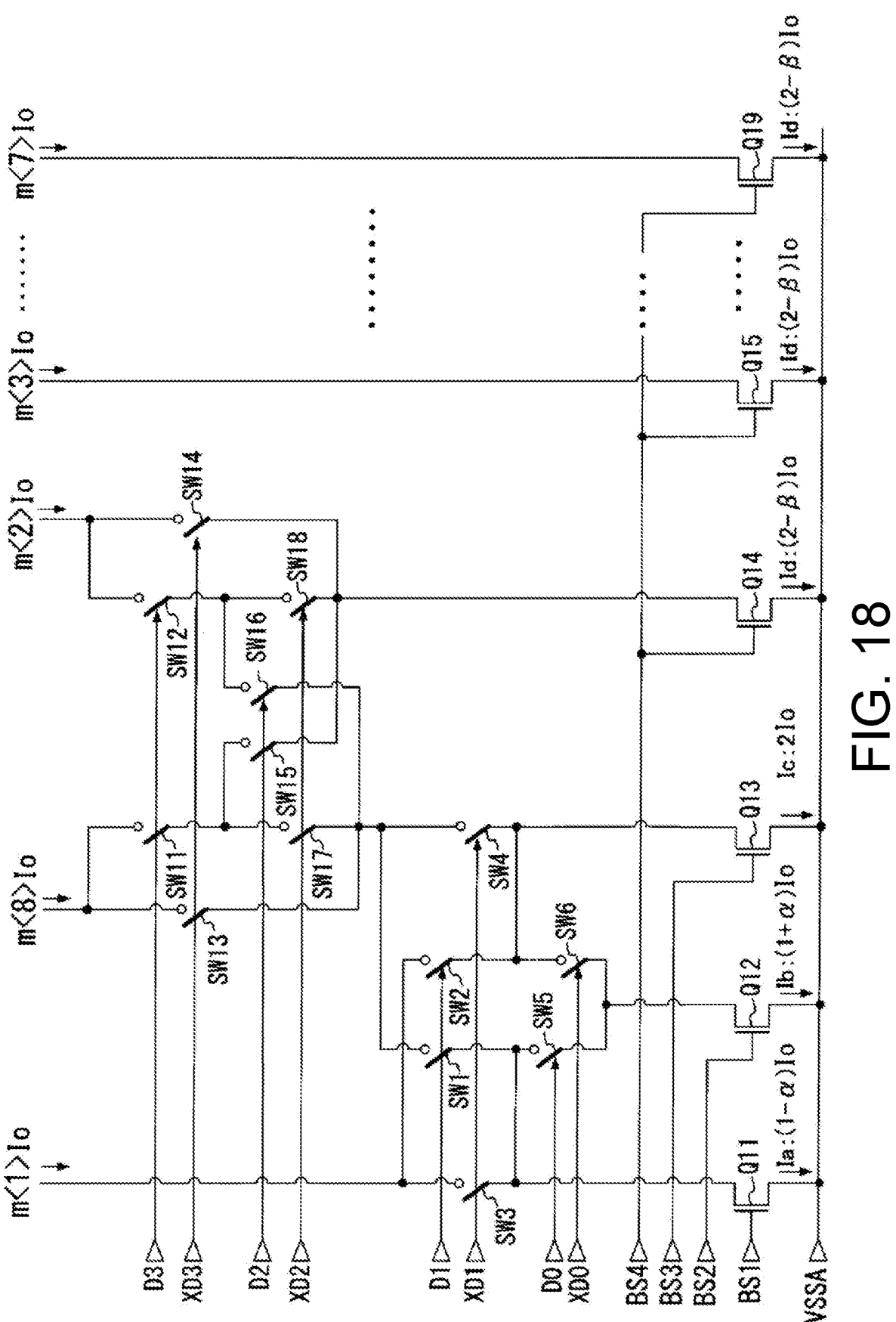
FIG. 18 is a circuit diagram showing another example of the tail current control circuit 13C.

FIG. 18 is a circuit diagram employed when realizing the tail current control circuit 13C with specifications obtained by applying the correction of the tail current ratio as shown in FIG. 17C and FIG. 17D.

In the configuration shown in FIG. 18, the tail current control circuit 13C includes current source transistors Q11 to Q19 and transistor switches SW1 to SW6 and SW11 to SW18.

The current source transistor Q11 receives the bias voltage signal BS1 at the gate, thereby generating a constant current Ia corresponding to the tail current ratio "1−α" obtained by subtracting the correction value α from the tail current ratio "1" in the basic specifications shown in FIG. 17A and FIG. 17B.

The current source transistor Q12 receives the bias voltage signal BS2 at the gate, thereby generating a constant current Ib corresponding to the tail current ratio "1+α" obtained by adding the correction value α to the tail current ratio "1" in the basic specifications shown in FIG. 17A and FIG. 17B. The current source transistor Q13 receives the bias voltage signal BS3 at the gate, thereby generating a constant current Ic corresponding to the tail current ratio "2" in the basic specifications shown in FIG. 17A and FIG. 17B.

Each of the current source transistors Q14 to Q19 receives the bias voltage signal BS4 at the gate, thereby respectively generating a constant current Id corresponding to the tail current ratio "2−β" obtained by subtracting the correction value β from the tail current ratio "2" in the basic specifications shown in FIG. 17A and FIG. 17B.

The transistor switches SW1 and SW2 are controlled on/off according to the bit D1 of the digital data signal DT, and the transistor switches SW3 and SW4 are controlled on/off according to the inverted bit XD1 of the bit D1. The transistor switch SW5 is controlled on/off according to the bit D0 of the digital data signal DT, and the transistor switch SW6 is controlled on/off according to the inverted bit XD0 of the bit D0. The transistor switches SW11 and SW12 are controlled on/off according to the bit D3 of the digital data signal DT, and the transistor switches SW13 and SW14 are controlled on/off according to the inverted bit XD3 of the bit D3. The transistor switches SW15 and SW16 are controlled on/off according to the bit D2 of the digital data signal DT, and the transistor switches SW17 and SW18 are controlled on/off according to the inverted bit XD2 of the bit D2.

That is, in the configuration shown in FIG. 18, the tail currents m<1>Io, m<2>Io, and m<8>Io are generated by selecting the path of the current flowing through each of the current source transistors Q11 to Q14 using the transistor switches SW1 to SW6 and SW11 to SW18 based on the digital data signal DT. Then, as shown in FIG. 17C and FIG. 17D, the tail current ratios m<1> and m<8> ((D3, D2) is other than (1, 1)) and the tail current ratios m<1> and m<2> ((D3, D2) is (1, 1)) are controlled to change into three levels, "1−α", "2", and "3+α", for each digital code of the digital data signal DT. The tail current ratios m<2> ((D3, D2) is other than (1, 1)) and m<8> ((D3, D2) is (1, 1)) are controlled to the fixed value "2−β".

Since the tail current ratios m<3> to m<7> of the tail currents m<3>Io to m<7>Io are fixed regardless of the digital data signal DT, that is, "2−β", the tail currents m<3>Io to m<7>Io are directly generated by the current source transistors Q15 to Q19.

Fifth Embodiment

Figure 19:
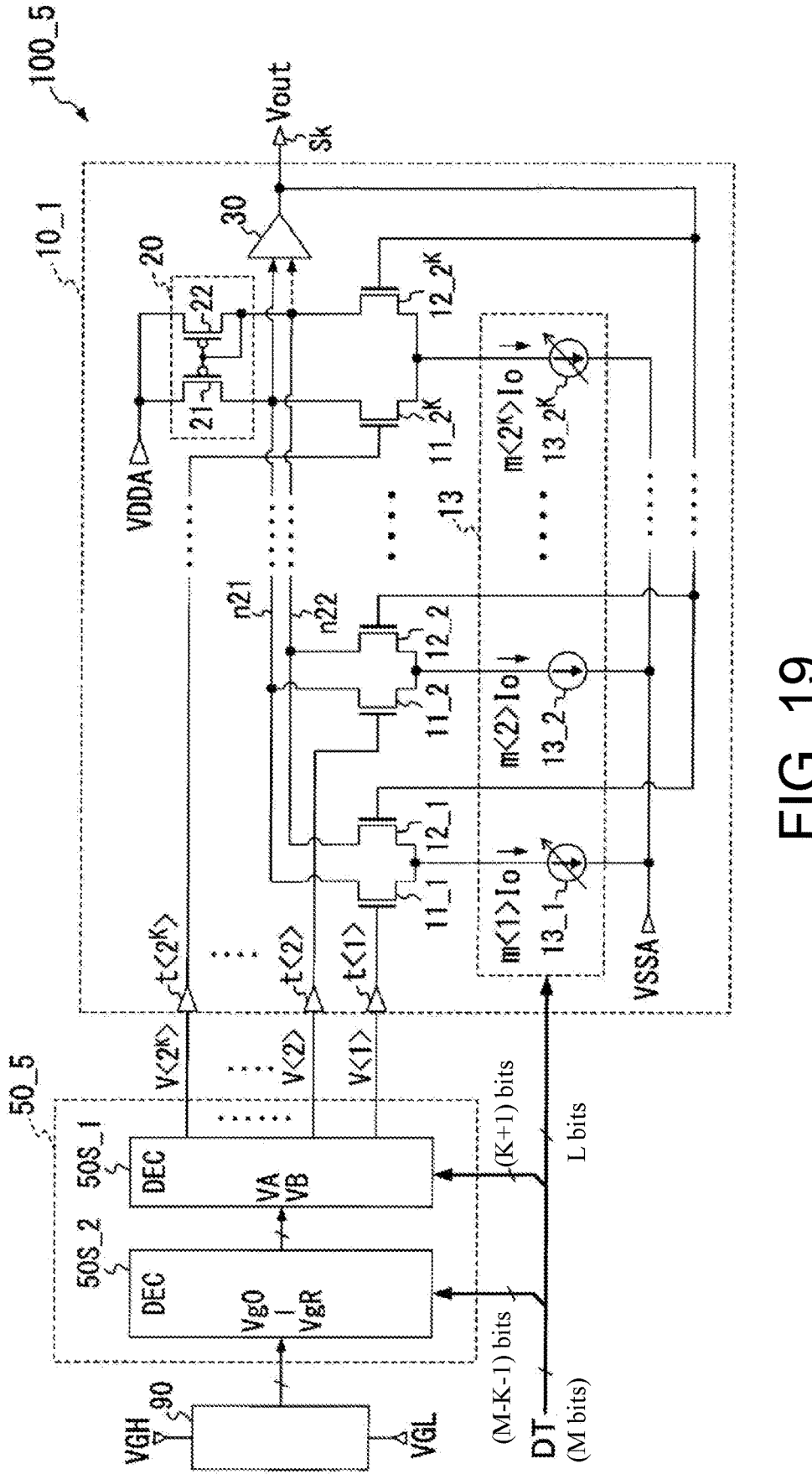
FIG. 19 is a circuit diagram showing the configuration of the digital-to-analog converter 100_5 corresponding to the digital data signal whose number of bits is expanded to M (M>K+1) bits.

FIG. 19 is a circuit diagram showing the configuration of a digital-to-analog converter 100_5 according to the fifth embodiment of the disclosure.

The digital-to-analog converter 100_5 uses the differential amplifier 10_1 including the $2^K$ differential pairs (11_1, 12_1) to (11_2$^K$, 12_2$^K$) shown in FIG. 1 to expand the number of bits of the digital data signal DT to be converted to M bits (M is an integer greater than K+1), which is more than (K+1) bits.

It should be noted that the digital-to-analog converter 100_5 employs a decoder 50_5 and a reference voltage generation part 90 instead of the decoder 50_1 shown in FIG. 1, and the configuration of the differential amplifier 10_1 is the same as shown in FIG. 1.

The reference voltage generation part 90 receives a DC reference power supply voltage VGH and a reference power supply voltage VGL lower than the reference power supply voltage VGH. The reference voltage generation part 90 generates reference voltages Vg0 to VgR (R is an integer of 2 or more) having different voltage values based on the reference power supply voltages VGH and VGL, and supplies the reference voltages Vg0 to VgR to the decoder 50_5.

The decoder 50_5 includes sub-decoders 50S_1 and 50S_2.

The sub-decoder 50S_2 receives the M-bit digital data signal DT and the reference voltages Vg0 to VgR, and selects a pair of mutually adjacent voltages from the reference voltages Vg0 to VgR as two voltages (VA, VB) based on the upper bits of M-bit digital data, for example, the upper (M−K−1) bits. The sub-decoder 50S_2 supplies the two selected voltages (VA, VB) to the sub-decoder 50S_1.

The sub-decoder 50S_1 selects a combination of assigning one or the other of the voltages (VA, VB) respectively to the $2^K$ terminals, that is, the input terminals t<1> to t<2$^K$>, of the differential amplifier 10_1 based on the lower (K+1) bits of the M-bit digital data and the two voltages (VA, VB). The sub-decoder 50S_1 supplies the voltage group, in which the voltages (VA, VB) are respectively assigned to the input terminals t<1> to t<2$^K$>, as input voltages V<1> to V<2$^K$> to the input terminals t<1> to t<2$^K$> of the differential amplifier 10_1. It should be noted that the operation of the differential amplifier 10_1 is the same as the operation described using FIG. 2A and FIG. 2B above.

FIG. 20 shows an example of the specifications of the voltage level (output level) output from the output terminal Sk by action of the sub-decoder 50S_2 and the differential amplifier 10_1 based on the two voltages (VA, VB) selected by the sub-decoder 50S_2 using the upper (M−K−1) bits of M-bit digital data, and the lower (K+1) bits, when K=2, for example, in the digital-to-analog converter 100_5 shown in FIG. 19. According to such specifications, the sub-decoder 50S_2 selects the voltage levels of the two voltages (VA, VB) at intervals of 8 output levels, that is, (0, 8), (8, 16), (16, 24), etc., corresponding to the upper (M−K−1) bits of the digital data signal DT, thereby obtaining the output levels 1 to 8, 9 to 16, 17 to 24, and so on as the analog output voltage signal Vout.

Sixth Embodiment

Figure 21:
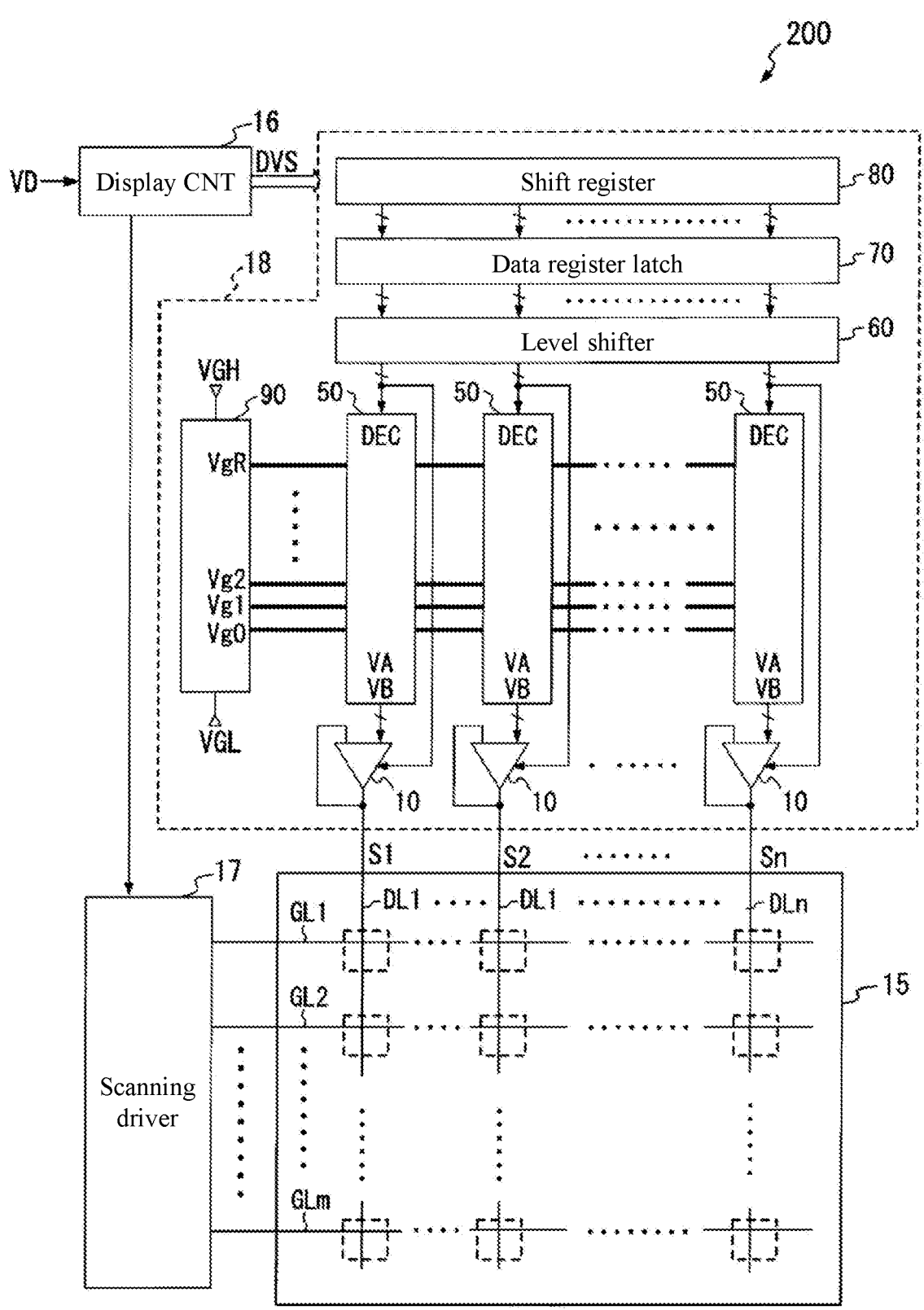
FIG. 21 is a block diagram showing the schematic configuration of the display device 200 including the data driver according to the disclosure.

FIG. 21 is a block diagram showing the configuration of a display device 200 including a data driver that includes the digital-to-analog converter (100_1 to 100_5) described above.

The display device 200 includes a display panel 15, a display controller 16, a scanning driver 17, and a data driver 18.

The display panel 15 is composed of, for example, a liquid crystal panel or an organic EL panel, and includes m horizontal scan lines GL1 to GLm (m is a natural number of 2 or more) extending in the horizontal direction of the two-dimensional screen, and n data lines DL1 to DLn (n is a natural number of 2 or more) extending in the vertical direction of the two-dimensional screen. A display cell serving as a pixel is formed at each intersection of the horizontal scan lines and the data lines.

Based on a video signal VD, the display controller 16 generates a video digital signal DVS that includes various control signals, such as a start pulse, a clock signal, vertical and horizontal synchronization signals, and a series of video digital data pieces representing the brightness level of each pixel.

The display controller 16 generates a scan timing signal synchronized with the above horizontal synchronization signal and supplies the scan timing signal to the scanning driver 17, supplies the above video digital signal DVS to the data driver 18.

The scanning driver 17 sequentially applies a horizontal scan pulse to each of the horizontal scan lines GL1 to GLm of the display panel 15 based on the scan timing signal supplied from the display controller 16.

The data driver 18 includes a shift register 80, a data register latch 70, a level shifter 60, a reference voltage generation part 90, n decoders 50, and n differential amplifiers 10.

The shift register 80 generates a plurality of latch timing signals for selecting a latch in synchronization with the clock signal in response to the start pulse included in the video digital signal DVS, and supplies the latch timing signals to the data register latch 70.

Based on each of the latch timing signals supplied from the shift register 80, the data register latch 70 captures the video digital data pieces included in the video digital signal DVS every predetermined number (for example, n pieces), and supplies n video digital data signals representing each video digital data piece to the level shifter 60.

The level shifter 60 applies level shifting processing to each of the n video digital data signals supplied from the data register latch 70 to increase the signal amplitude thereof, and supplies the obtained n level-shifted video digital data signals respectively to the n decoders 50 that are provided respectively corresponding to n output channels of the data driver 18.

The reference voltage generation part 90 receives a DC reference power supply voltage VGH and a reference power supply voltage VGL lower than the reference power supply voltage VGH. The reference voltage generation part 90 generates reference voltages Vg0 to VgR having different voltage values based on the reference power supply voltages VGH and VGL, and supplies the reference voltages Vg0 to VgR to each of the n decoders 50.

Each of the decoders 50 selects a pair of reference voltages corresponding to the video digital data signal level-shifted by the level shifter 60 from the reference voltage group described above. Then, each of the decoders 50 supplies the selected pair of reference voltages, as two voltages (VA, VB), to the differential amplifiers 10 provided corresponding to the n output channels of the data driver 18, respectively.

The differential amplifier 10 generates an output voltage signal Vout having one of, for example, 16 levels of voltage that divides the input voltages VA and VB, and outputs this output voltage signal Vout as a drive signal. At this time, the n drive signals output from the n differential amplifiers 10 are respectively supplied to the data lines DL1 to DLn of the display panel 15 as drive signals Si to Sn.

Here, the digital-to-analog converter shown in FIG. 1, FIG. 3, FIG. 7, or FIG. 13 can be applied as the decoder 50 and differential amplifier 10 provided for each output channel of the data driver 18 shown in FIG. 21, and the reference voltage generation part 90, which makes it possible to save the area of the data driver 18.

As detailed above, in the disclosure, a digital-to-analog converter including the following differential amplifier and first decoder is employed as the digital-to-analog converter that outputs an output voltage having one of $2^{(K+1)}$ voltage levels obtained by dividing the first and second voltages (VA, VB) into $2^{(K+1)}$ according to (K+1) bits of digital data (K is a positive number of 1 or more).

The first decoder (50_1 to 50_4) receives the first and second voltages (VA, VB), and assigns and supplies the first voltage (VA) or the second voltage (VB) to each of a plurality of input terminals (t<1> to t<$2^K$>) of the differential amplifier based on the (K+1) bits of digital data (DT).

The differential amplifier (10_1 to 10_4) outputs a calculation result based on the voltages (V<1> to V<$2^K$>) respectively received at the plurality of input terminals (t<1> to t<$2^K$>), as the output voltage (Vout), from the output terminal thereof. This differential amplifier includes the following $2^K$ differential pairs, amplification stage, and tail current control circuit.

Each of the $2^K$ differential pairs (11_1, 12_1 to 11_$2^K$, 12_$2^K$) includes an inverting input terminal to which the output voltage (Vout) is commonly input, a non-inverting input terminal to which one of the voltages (V<1> to V<$2^K$>) received at the plurality of input terminals is supplied as an input voltage, and an output pair. The output pairs of the $2^K$ differential pairs are commonly connected, each of which is driven by a tail current (m<1>Io to m<$2^K$>Io) received individually.

The amplification stage (30) generates the output voltage (Vout) by an amplification effect based on output of one or both of the output pair of each of the $2^K$ differential pairs.

The tail current control circuit (13, 13_1 to 13_4) individually supplies the first to $2^{Kth}$ tail currents (m<1>Io to m<$2^K$>Io) to the $2^K$ differential pairs. In addition, the tail current control circuit controls, for each differential pair, the first to $2^{Kth}$ current ratios (m<1> to m<$2^K$>) of the first to $2^{Kth}$ tail currents to the reference current value (Io) based on the digital data (DT).

Furthermore, the tail current control circuit is basically configured to set each of the first to $2^{Kth}$ current ratios to one of three predetermined values (for example, "1", "2", or "3"), and variably controls the value of the current ratio (for example, m<1>, m<$2^K$>) of the tail currents supplied to at least two predetermined differential pairs (for example, [11_1, 12_1], [11_$2^K$, 12_$2^K$]) of the $2^K$ differential pairs to one of three values based on the digital data. This makes it possible to increase the number of voltage levels of the output voltage with a small number of differential pairs, and to save the area of the digital-to-analog converter.

Furthermore, in the tail current control circuit of the digital-to-analog converter according to the disclosure, in controlling the value of the current ratio of the tail currents supplied to at least two differential pairs to the maximum value, the minimum value, or the intermediate value among the three values based on the digital data, correction is performed to increase one of the maximum value and the minimum value and to decrease the other. This makes it possible to suppress an error in the output voltage that occurs due to variable control of the current ratio of the tail currents.

Therefore, according to the disclosure, it is possible to provide a digital-to-analog converter, a data driver, and a display device that are capable of saving area without causing a decrease in output error.

What is claimed is:

1. A digital-to-analog converter, configured to output an output voltage having one of $2^{(K+1)}$ voltage levels obtained by dividing a first voltage and a second voltage into $2^{(K+1)}$ according to (K+1) bits of digital data (K is a positive number of 1 or more), the digital-to-analog converter comprising:

a differential amplifier comprising a plurality of input terminals and configured to output a calculation result based on voltages respectively received at the plurality of input terminals from an output terminal of the differential amplifier as the output voltage; and a first decoder configured to receive the first voltage and the second voltage and assign and supply the first voltage or the second voltage to each of the plurality of input terminals of the differential amplifier based on the (K+1) bits of digital data, wherein the differential amplifier comprises:

$2^K$ differential pairs each comprising an inverting input terminal to which the output voltage is commonly input, a non-inverting input terminal to which one of the voltages received at the plurality of input terminals is supplied as an input voltage, and an output pair, wherein the output pairs are commonly connected, each of which is driven by a tail current received individually;

an amplification stage configured to generate the output voltage by an amplification effect based on output of one or both of the output pair of each of the $2^K$ differential pairs; and a tail current control circuit configured to individually supply first to $2^{Kth}$ tail currents to the $2^K$ differential pairs and control, for each differential pair, first to $2^{Kth}$ current ratios of the first to $2^{Kth}$ tail currents to a reference current value based on the digital data, wherein the tail current control circuit is configured to set each of the first to $2^{Kth}$ current ratios to a maximum value, a minimum value, or an intermediate value among three predetermined values and perform correction to increase one of the maximum value and the minimum value and decrease the other for the current ratio of the tail currents supplied to at least two predetermined differential pairs of the $2^K$ differential pairs.

2. The digital-to-analog converter according to claim 1, wherein the tail current control circuit is configured to set each of the first to $2^{Kth}$ current ratios to one of the maximum value, the minimum value, and the intermediate value so that a value obtained by weighting and averaging first to $2^{Kth}$ input voltages respectively received at the non-inverting input terminals of the $2^K$ differential pairs by weighting of the first to $2^{Kth}$ current ratios is equal to an expected value of the output voltage corresponding to the digital data.

3. The digital-to-analog converter according to claim 2, wherein the tail current control circuit is configured to fixedly set the current ratio of the tail current supplied to each differential pair, excluding the predetermined two differential pairs, among the $2^K$ differential pairs to a value obtained by increasing or decreasing the intermediate value by a predetermined value regardless of the digital data.

4. The digital-to-analog converter according to claim 1, wherein each of the $2^K$ differential pairs comprises a transistor pair having the same conductivity type and equivalent characteristics, and the differential pairs are also transistor pairs having the same conductivity type and equivalent characteristics.

5. The digital-to-analog converter according to claim 1, wherein the tail current control circuit is configured to control each of the current ratios so that a sum or average of the current ratio of the tail current supplied to each of the $2^K$ differential pairs is substantially constant.

6. The digital-to-analog converter according to claim 1, wherein the first decoder is configured to selectively output at least one of the first voltage and the second voltage to one of the predetermined two differential pairs and selectively output the other of the first voltage and the second voltage to the other of the predetermined two differential pairs in response to outputting the output voltage having a voltage value other than the same voltage value as the first voltage or the second voltage.

7. The digital-to-analog converter according to claim 1, wherein the tail current control circuit is configured to replace a control target of the current ratio of the tail current with respect to the predetermined two differential pairs with another differential pair having the same input voltage value according to the digital data.

8. The digital-to-analog converter according to claim 1, wherein the tail current control circuit is configured to perform correction by adding a predetermined value to the maximum value as the current ratio of the tail current supplied to each of the predetermined two differential pairs and subtracting the predetermined value from the minimum value in response to outputting the output voltage having an odd-numbered magnitude voltage level from the first voltage or the second voltage, among first to $w^{th}$ voltage levels (w is a positive number of 2 or more) excluding a maximum voltage level and a minimum voltage level of the $2^{(K+1)}$ voltage levels in the output voltage, and control the current ratio of the tail current supplied to each of the predetermined two differential pairs to the intermediate value in response to outputting the output voltage having an even-numbered magnitude voltage level from the first voltage or the second voltage, among the first to $w^{th}$ voltage levels.

9. The digital-to-analog converter according to claim 1, wherein the tail current control circuit comprises:

a plurality of constant current sources with fixed current ratios; and a switch circuit configured to select a combination of currents synthesized from the plurality of constant current sources based on the predetermined bits of the (K+1) bits of digital data, wherein a current supplied via the switch circuit is supplied to the differential pair with a variable current ratio, among the tail currents supplied to the $2^K$ differential pairs.

10. The digital-to-analog converter according to claim 1, further comprising:

a reference voltage generation part configured to generate a plurality of reference voltages having different voltage values; and a second decoder configured to receive M (M is an integer greater than K+1) bits of digital data including the (K+1) bits of digital data and the plurality of reference voltages and respectively select and supply two adjacent reference voltages from the plurality of reference voltages to the first decoder as the first voltage and the second voltage based on (M−K−1) bits of the M bits of digital data.

11. A data driver, comprising a plurality of the digital-to-analog converters according to claim 1, the data driver being configured to convert each video digital data piece representing a brightness level of each pixel as a digital value into a plurality of the output voltages each having an analog voltage value by the plurality of digital-to-analog converters, and respectively supply a plurality of drive signals respectively having the plurality of output voltages to a plurality of data lines of a display panel.

12. A display device, comprising:

a display panel comprising a plurality of data lines to which a plurality of display cells are respectively connected; and a data driver comprising a plurality of the digital-to-analog converters according to claim 1 and configured to convert each video digital data piece representing a brightness level of each pixel as a digital value into a plurality of the output voltages each having an analog voltage value by the plurality of digital-to-analog converters, and respectively supply a plurality of drive signals respectively having the plurality of output voltages to the plurality of data lines of the display panel.

\*  \*  \*  \*  \*